United States Patent
Taki

(10) Patent No.: US 8,107,487 B2
(45) Date of Patent: Jan. 31, 2012

(54) PACKET COMMUNICATION DEVICE FOR COMMUNICATING PACKET TO BE TRANSFERRED THROUGH PACKET COMMUNICATION WHICH IS TIME-MANAGED IN CONSTANT CYCLE AND PACKET COMMUNICATION METHOD THEREOF

(75) Inventor: Nobuhiro Taki, Kasugai (JP)

(73) Assignee: Fujitsu Semiconductor Limited, Yokohama (JP)

( * ) Notice: Subject to any disclaimer, the term of this patent is extended or adjusted under 35 U.S.C. 154(b) by 147 days.

(21) Appl. No.: 12/434,415

(22) Filed: May 1, 2009

(65) Prior Publication Data
US 2009/0300246 A1 Dec. 3, 2009

(30) Foreign Application Priority Data

May 30, 2008 (JP) ................................. 2008-143308

(51) Int. Cl.
H04L 12/28 (2006.01)
H04L 12/56 (2006.01)
(52) U.S. Cl. .......................... 370/419; 370/375; 370/389
(58) Field of Classification Search .................. 370/389, 370/458–538, 395.62, 392; 725/28, 29; 375/E7.019; 348/E5.122, E7.024
See application file for complete search history.

(56) References Cited

U.S. PATENT DOCUMENTS

| | | | | |
|---|---|---|---|---|
| 5,832,310 | A | * | 11/1998 | Morrissey et al. .............. 710/71 |
| 6,405,275 | B1 | * | 6/2002 | Morrow et al. ............... 710/305 |
| 6,584,103 | B1 | * | 6/2003 | Hanaoka et al. .............. 370/389 |
| 2002/0009055 | A1 | * | 1/2002 | Sugaya .......................... 370/252 |
| 2002/0152346 | A1 | * | 10/2002 | Stone et al. ................... 710/305 |
| 2005/0198426 | A1 | * | 9/2005 | Smyers et al. ................ 710/305 |
| 2006/0050738 | A1 | * | 3/2006 | Carr et al. ..................... 370/474 |
| 2007/0079342 | A1 | * | 4/2007 | Ellis et al. ....................... 725/89 |
| 2010/0138882 | A1 | * | 6/2010 | Ellis et al. ....................... 725/93 |

FOREIGN PATENT DOCUMENTS

| | | |
|---|---|---|
| EP | 1 033 657 A2 | 9/2000 |
| JP | 11-212896 A | 8/1999 |
| JP | 2000-151656 A | 5/2000 |
| JP | 2000-253023 A | 9/2000 |

* cited by examiner

*Primary Examiner* — Ayaz Sheikh
*Assistant Examiner* — Mounir Moutaouakil
(74) *Attorney, Agent, or Firm* — Arent Fox LLP

(57) ABSTRACT

A packet communication device for communicating a packet to be transferred in constant cycle, comprising one of a logic inversion section configured to invert a logical value with respect to at least one bit included in a first string of bits included in a first packet; and a register section configured to store another string of bits having a logical value different from a given logical value of the first string of bits; and a selector section configured to select one of the first string of bits and a second string of bits that is output from one of the logic inversion section and the register section to designate any one of a plurality of devices, wherein the packet communication is performed when a selected string of bits selected by the selector section conforms to a setting value of a receiving side.

1 Claim, 24 Drawing Sheets

FIG. 1 CONNECTION BLOCK DIAGRAM IN FIRST EMBODIMENT

FIG. 2  SPECIFIC EXAMPLE OF CRC CHANGING PORTION 3

FIG. 3  TRANSFER OF PACKETS ON 1394 BUS IN FIRST EMBODIMENT

FIG. 4  EXAMPLE OF OUTPUT MANNER IN FIRST EMBODIMENT

FIG. 5  BLOCK DIAGRAM OF DEVICES IN SECOND EMBODIMENT

FIG. 7  TRANSFER OF PACKETS ON 1394 BUS IN SECOND EMBODIMENT

FIG. 8  EXAMPLE OF OUTPUT MANNER IN SECOND EMBODIMENT

FIG. 9 BLOCK DIAGRAM 1 OF DEVICE IN THIRD EMBODIMENT

FIG. 10 BLOCK DIAGRAM 2 OF DEVICE IN THIRD EMBODIMENT

FIG. 11 CONNECTION BLOCK DIAGRAM IN THIRD EMBODIMENT

FIG. 12 TRANSFER OF PACKETS ON 1394 BUS IN THIRD EMBODIMENT

FIG. 13    EXAMPLE OF OUTPUT MANNER IN THIRD EMBODIMENT

FIG. 14  BLOCK DIAGRAM OF DEVICE IN FOURTH EMBODIMENT

FIG. 15  TRANSFER OF PACKETS ON 1394 BUS IN FOURTH EMBODIMENT

FIG. 16 CONNECTION BLOCK DIAGRAM IN FIFTH EMBODIMENT

FIG. 18 TRANSFER OF PACKETS ON 1394 BUS IN SIXTH EMBODIMENT

FIG. 19  EXAMPLE OF OUTPUT MANNER IN SIXTH EMBODIMENT

FIG. 20 CONNECTION BLOCK DIAGRAM IN SEVENTH EMBODIMENT

FIG. 21 (RELATED ART)
FORMAT OF CYCLE START PACKET

| destination_ID | tl | rt | tcode | pri |
| source_ID | | | | |
| destination_offset | | | | |
| cycle_time_data | | | | |
| header_CRC | | | | |

FIG. 22 (RELATED ART) CONVENTIONAL TRANSFER OF PACKETS ON 1394 BUS (1)

EXAMPLE OF CONVENTIONAL OUTPUT MANNER

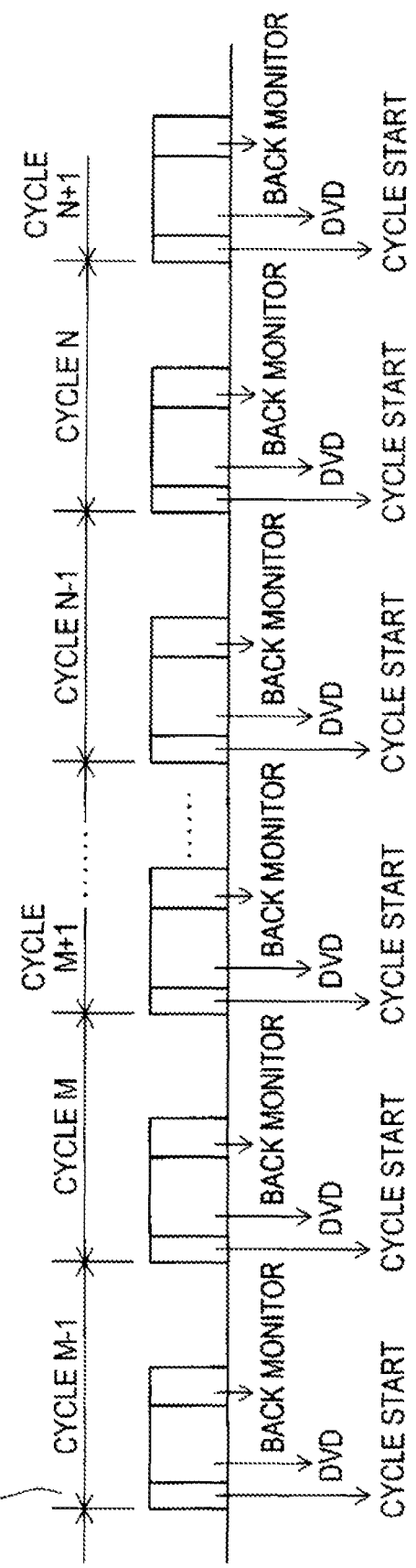
FIG. 24 (RELATED ART) CONVENTIONAL TRANSFER OF PACKETS ON 1394 BUS (2)

PACKET COMMUNICATION DEVICE FOR COMMUNICATING PACKET TO BE TRANSFERRED THROUGH PACKET COMMUNICATION WHICH IS TIME-MANAGED IN CONSTANT CYCLE AND PACKET COMMUNICATION METHOD THEREOF

CROSS-REFERENCE TO RELATED APPLICATIONS

This application is based upon and claims the benefit of priority of the prior Japanese Patent Application No. 2008-143308, filed on May 30, 2008, the entire contents of which are incorporated herein by reference.

FIELD

The embodiments discussed herein are directed to a packet communication device and a packet communication method. More particularly, the embodiments are directed to a device and method for data communication in packet units through a serial bus compliant with IEEE 1394 standard.

BACKGROUND

Standards for serial buses for realizing high-speed data transfers include IEEE 1394 standard. Various technologies employing the IEEE 1394 standard have been proposed until present. One such technology is disclosed in the Japanese Patent Applications Laid-Open No. 11-212896 and 2000-253023.

The IEEE 1394 standard supports isochronous transfers and asynchronous transfers. Isochronous transfers are transfers which are time-managed in 125 μs cycles (isochronous cycles) and have a constant transfer bandwidth. As the transfer bandwidth is reliably secured for this type of transfers, isochronous transfers are suitable for transfers of video images and the like wherein interruptions are not permitted. Alternatively, asynchronous transfers are transfers wherein data transfers are reliably carried out without any time management.

FIG. 21 depicts a format of a cycle start packet which is transmitted in each isochronous cycle. The cycle start packet is made up of 32-bit data sequences (quadrate data). A destination_ID refers to an identifier for a transmission destination, while a source_ID refers to an identifier for a transmission source. A transaction label t1 is a label for identifying various transactions. Also, rt indicates a retry code, tcode indicates a transaction code, pri indicates a priority order, destination_offset indicates packet type-inherent information and cycle_time_data indicates packet type-inherent quadrate data, respectively. A header_CRC indicates cyclic redundancy check (hereinafter referred to as CRC) data for checking for errors error in the 4 quadrate data items.

SUMMARY

According to an aspect of the invention, a packet communication device for switching packets to be transferred in packet communication which is time-managed in constant cycles, the packet communication device includes a changing section configured to change a portion of a first packet to be transmitted in each of the constant cycles.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 21 depicts a format of a cycle start packet;

FIG. 24 illustrates conventional transfer of packets on the IEEE 1394 bus 200.

DESCRIPTION OF EMBODIMENTS

In recent years, the IEEE 1394 standard has been used mostly for home networking and in-vehicle networking, rather than as an interface between AV devices, and a computer and peripherals.

However, the following problems may occur in the case the IEEE 1394 standard is used for in-vehicle networking, for instance.

Video images and the like are transferred in in-vehicle networks in an isochronous transfer suitable for the transfer of such video images as described earlier. Isochronous packets subjected to isochronous transfer as supported by the IEEE 1394 standard are transferred in real time with the transfer bandwidth to be used secured in advance, and without interruptions. Accordingly, in the case of transferring isochronous packets, procedures for reserving the band are preferably carried out in advance. To change isochronous packets which are currently being transferred to transfer of separate isochronous packets, once the operating band is released, a procedure is subsequently preferably carried out to reserve new band. Specifically, these procedures for releasing band and reserving band for switching the transfer data make it impossible to switch transfer data at high speed.

Figure 22:
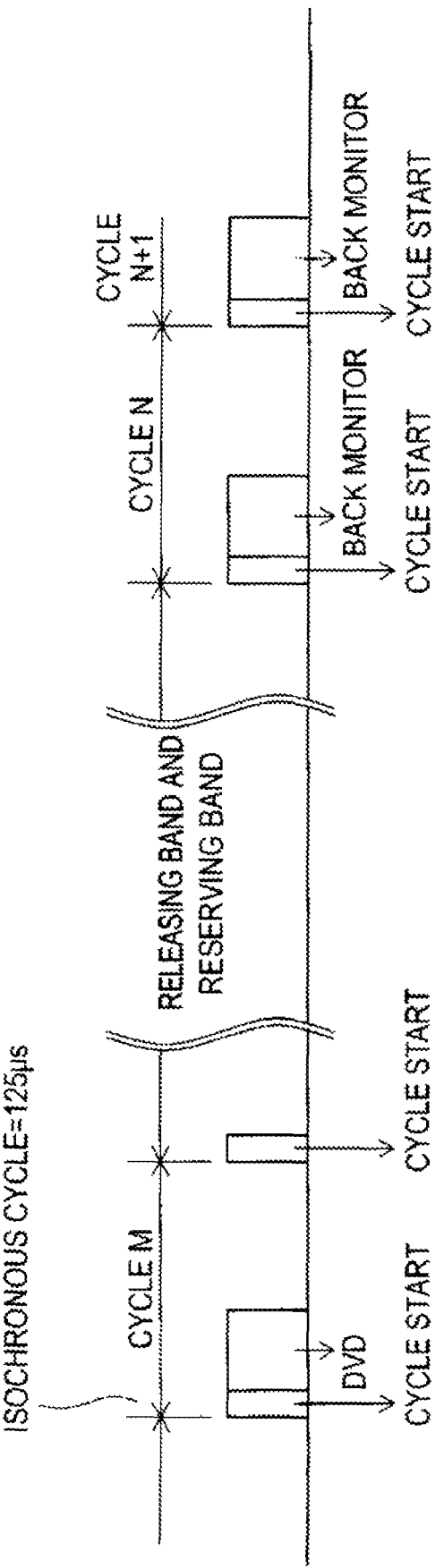
FIG. 22 illustrates conventional transfer of packets on the IEEE 1394 bus 200.
Figure 23:
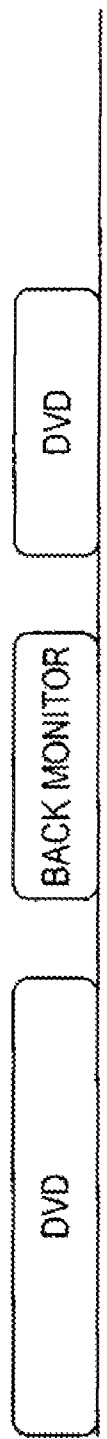
FIG. 23 depicts conventional display contents to be outputted to an in-vehicle display device.

For instance, when an attempt is made to switch, in an emergency case, from an environment wherein DVD video images are displayed to video images of a back monitor in an in-vehicle network, packets of DVD video image data and packets of video image data from the back monitor may not be changed instantly, as illustrated in FIG. 22. Procedures for releasing band and for reserving band are carried out between a cycle M wherein packets of DVD video image data are transferred and a cycle N wherein transfer of packets of video image data from the back monitor is initiated. As a result, video images to be outputted to an in-vehicle display device are interrupted between DVD video images and video images of the back monitor, as illustrated in FIG. 23.

To solve this problem, all video image data was transferred on an IEEE 1394 bus in conventional art, as illustrated in FIG. 24. Accordingly, an IEEE 1394 bus band is used to transfer video image data which is not to be outputted to the display device, which then restricts the size of the transferable video image data.

The embodiments have been worked out in view of the above-described problems. According to the embodiments, a packet communication device and a packet communication method are proposed which enable switching of isochronous packets subjected to isochronous transfer as supported by IEEE 1394 standard, without carrying out procedures such as band releasing and band reserving.

Preferred embodiments of the present invention will be explained with reference to accompanying drawings.

Figure 1:
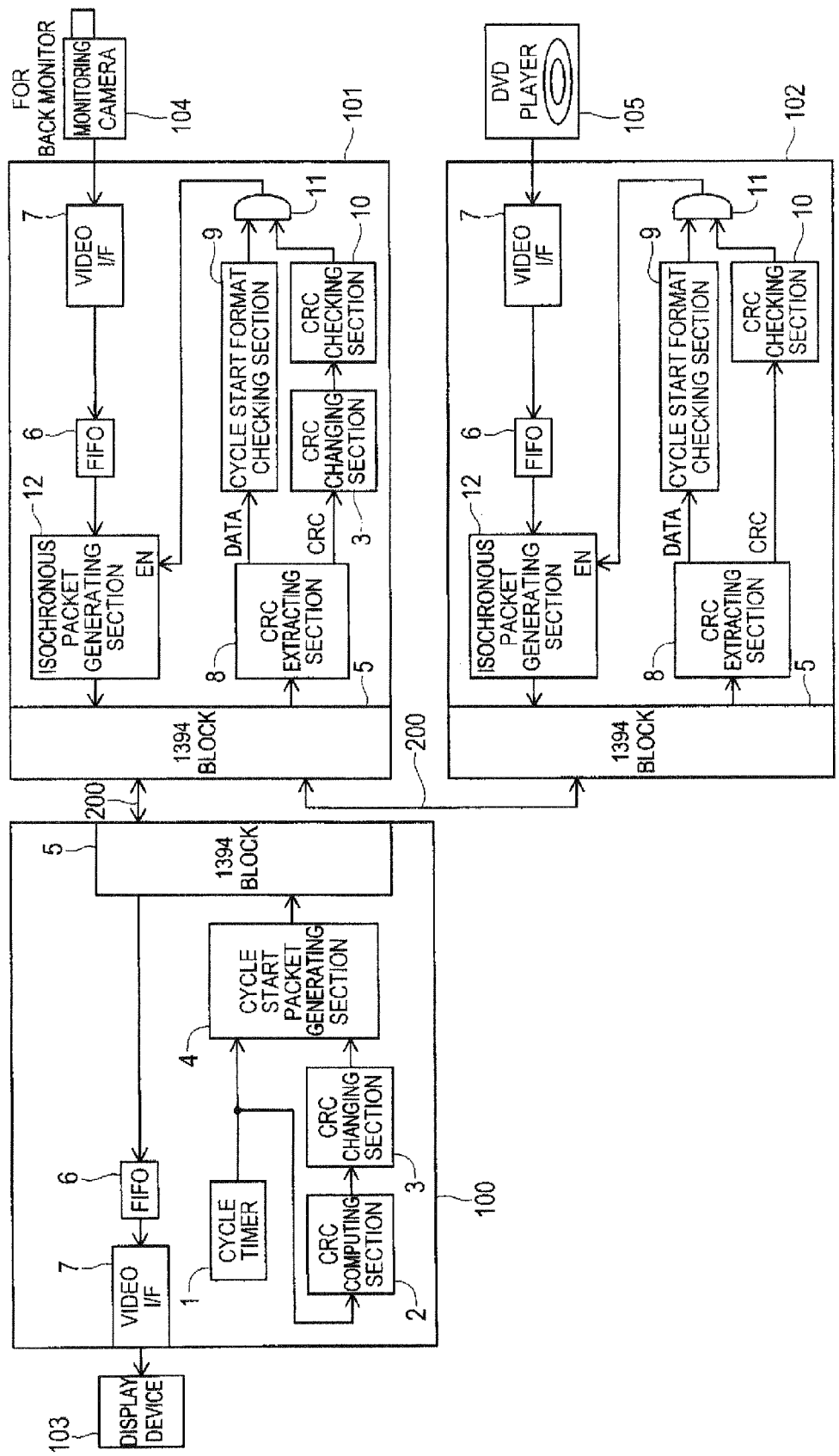
FIG. 1 is a block diagram illustrating connections in a first embodiment.

FIG. 1 is a block diagram illustrating connections in an in-vehicle network using a packet communication device according to a first embodiment. An isochronous packet receiving device 100 and isochronous packet transmitting devices 101 and 102 are connected through an IEEE 1394 bus 200. The receiving device 100 has a cycle timer 1, a CRC computing section 2, a CRC changing section 3, a cycle start packet generating section 4, a 1394 block 5, a FIFO 6 and a video I/F 7. The cycle timer 1 supplies 125 μs isochronous cycles. The cycle start packet generating section 4 generates a cycle start packet having a header_CRC attached thereto. This header_CRC is computed in the CRC computing section 2 and changed in the CRC changing section 3. The cycle start packet thus generated is transmitted on the IEEE 1394 bus 200 through the 1394 block 5 and is transferred to the transmitting devices 101 and 102. The isochronous packets transferred from the transmitting devices 101 and 102 through the IEEE 1394 bus 200 are outputted to the display device 103 through the 1394 block 5, FIFO 6 and video I/F 7 provided in the receiving device 100.

The transmitting devices 101 and 102 each have a 1394 block 5, a CRC extracting section 8, a cycle start format checking section 9, a CRC checking section 10, an AND gate 11, an isochronous packet generating section 12, a FIFO 6 and a video I/F 7. The transmitting device 101 further has a CRC changing section 3. A monitoring camera 104 for the back monitor is connected to the transmitting device 101. Isochronous packets of video image data for the back monitor are generated in the isochronous packet generating section 12 through the video I/F 7 and FIFO 6. Alternatively, a DVD player 105 is connected to the transmitting device 102. Isochronous packets of DVD video image data are generated in the isochronous packet generating section 12 through the video I/F 7 and FIFO 6.

The cycle start packet transmitted from the receiving device 100 is inputted to the CRC extracting section 8 through the 1394 block 5 in the transmitting sections 101 and 102. The CRC extracting section 8 extracts the leader_CRC of the cycle start packet. The cycle start format checking section 9 checks whether or not Data representing data from the cycle start packet excluding the CRC is compliant with the IEEE 1394 standard. In the transmitting device 101, the CRC data is inputted to the CRC checking section 10 through the CRC changing section 3. In the transmitting device 102, the CRC data is inputted to the CRC checking section 10 directly. The CRC checking section 10 then checks whether there are errors in this data. The cycle start format checking section 9 and the CRC checking section 10 input the checking results to an AND gate 11. An output of the AND gate 11 is connected to an enable terminal EN of the isochronous packet generating section 12. Accordingly, if the checking results as processed in the cycle start format checking section 9 and the CRC checking section 10 are recognized as normal, enabling of the isochronous packet generating section 12 is asserted.

Figure 2:
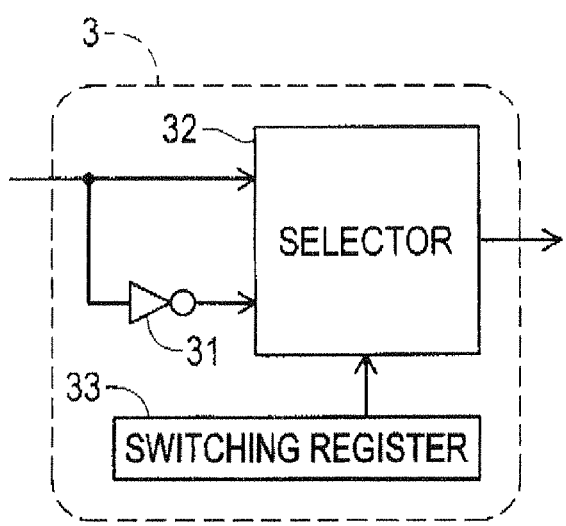
FIG. 2 illustrates a specific example of a CRC changing section 3.

FIG. 2 illustrates a specific example of the CRC changing section 3. The CRC changing section 3 has an inverter 31, a selector 32 and a switching register 33, as illustrated in FIG. 2. The selector 32 selects whether to output either a through input without passing through the inverter 31 or an inverted-side input which passes through the inverter 31, based on a value set in the switching register 33. In the first embodiment, the CRC changing section 3 provided in the transmitting device 101 is set so as to input an inverted-side input.

The operation in the first embodiment having the above-described configuration will now be described. Normally, if the CRC changing section 3 provided in the receiving device 100 is set so as to output the through-side input, the cycle start packets transmitted from the receiving device 100 are normal cycle start packets. Checking results with respect to the cycle start packets to be transmitted from the receiving device 100, as processed in the cycle start format checking section 9 and the CRC checking section 10 are recognized as normal in the transmitting device 102 which does not have the CRC changing section 3. Accordingly, enabling of the isochronous packet generating section 12 is asserted, which enables transfer of isochronous packets of video image data from a DVD player 105 to the IEEE 1394 bus 200.

Alternatively, the CRC changing section 3 provided in the transmitting device 101 is set so as to output an inverted-side input. The checking results with respect to the cycle start packets to be transmitted from the receiving device 100, as processed in the CRC checking section 10, are recognized as normal in the transmitting device 101 which has the CRC changing section 3. Accordingly, enabling of the isochronous packet generating section 12 is not asserted, which disables transfer of isochronous packets of video image data from a monitoring camera 104 of the back monitor to the IEEE 1394 bus 200. Thus, only isochronous packets of video image data from a DVD player 105 are transferred to the IEEE 1394 bus 200, and DVD video image data is outputted to the display device 103.

Here, once the display contents displayed on the display device 103 used for backing up the vehicle are switched to video images of the back monitor, setting of the CRC changing section 3 provided in the receiving device 100 is switched so as to output the inverted-side input. Thus, cycle start packets having an inverted header_CRC attached thereto are generated in the cycle start packet generating section 4 provided in the receiving device 100. Accordingly, the cycle start packet transmitted from the receiving device 100 becomes a cycle start packet with inverted CRC data. As a result, the checking results with respect to the cycle start packets to be transmitted from the receiving device 100, as processed in the CRC checking section 10 are not recognized as normal in the transmitting device 102 which does not have the CRC changing section 3. Accordingly, enabling of the isochronous packet generating section 12 is riot asserted, which stops transfer of isochronous packets of video image data from the DVD player 105 to the IEEE 1394 bus 200.

Alternatively, as the CRC changing section 3 provided in the transmitting device 101 is set so as to output an inverted-side input, the checking results with respect to the cycle start packets to be transmitted from the receiving device 100, as processed in the CRC checking section 10 are recognized as normal in the transmitting device 101 which has the CRC changing section 3. Accordingly, enabling of the isochronous packet generating section 12 is asserted, which enables transfer of isochronous packets of video image data from the monitoring camera 104 for the back monitor to the IEEE 1394 bus 200. Thus, only isochronous packets of video image data from a monitoring camera 104 for the back monitor is transferred to the IEEE 1394 bus 200, in place of video image data from the DVD player 105, while video image data of the back monitor is outputted to the display device 103.

Figure 3:
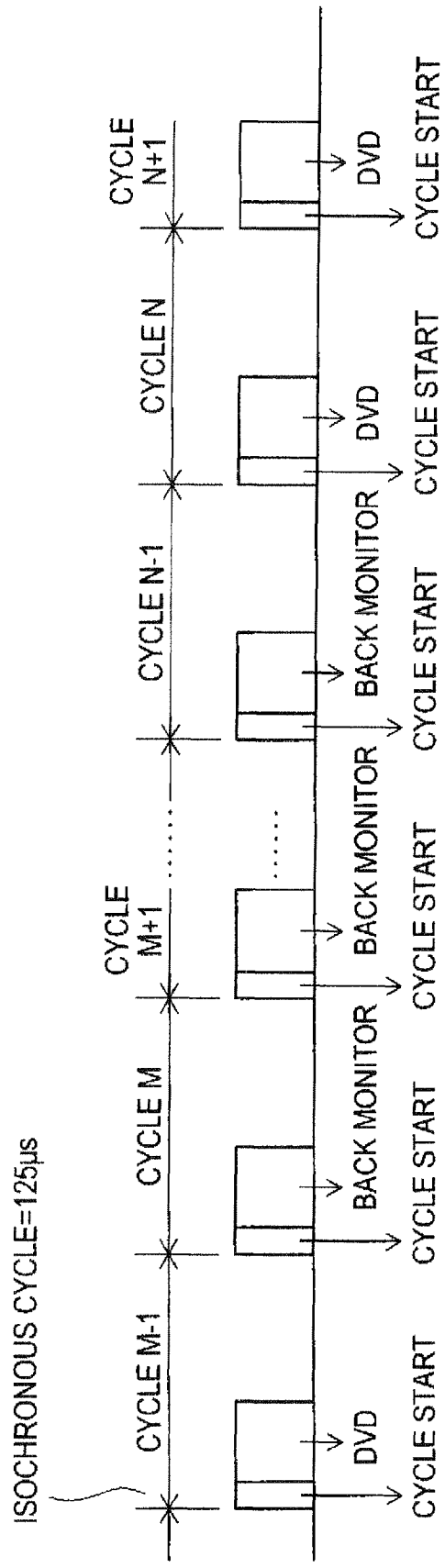
FIG. 3 depicts transfer of packets on the IEEE 1394 bus 200 in the first embodiment.
Figure 4:
FIG. 4 depicts the display contents to be outputted to a display device 103 in the first embodiment.

FIG. 3 depicts transfer of packets on the IEEE 1394 bus 200 in the first embodiment as described earlier. FIG. 4 depicts the display contents to be outputted to the display device 103. Starting with FIG. 3, gaps such as isochronous gaps and the like in the IEEE 1394 bus 200 of a Phy layer which may occur in packet transmission on the bus are omitted.

In the first embodiment described above, the through side input and inverted-side input in the CRC data in the cycle start packets to be transmitted from the receiving device 100 can be switched in the CRC changing section 3 provided in the receiving device 100. Enabling of the isochronous packet generating section 12 is asserted only at the transmitting device 101 or 102 which received the compliant cycle start packet, which enables transmission of such isochronous packet. Thus, isochronous packets to be transferred on the IEEE 1394 bus 200 as illustrated in FIG. 3 can be switched without any band release and band reserving procedures being carried out. As a result, the display contents of the display device 103 can be outputted without interruptions between the DVD video images and the video images of the back monitor, as illustrated in FIG. 4.

As per the conventional art example depicted in FIG. 24, as all video image data is not transferred on the IEEE 1394 bus 200, bus bands can be efficiently used. Further, as the transmitting device 101 or 102 from which no output is made to the display device 103 transmits no isochronous packets, power consumption can be suppressed.

Figure 5:
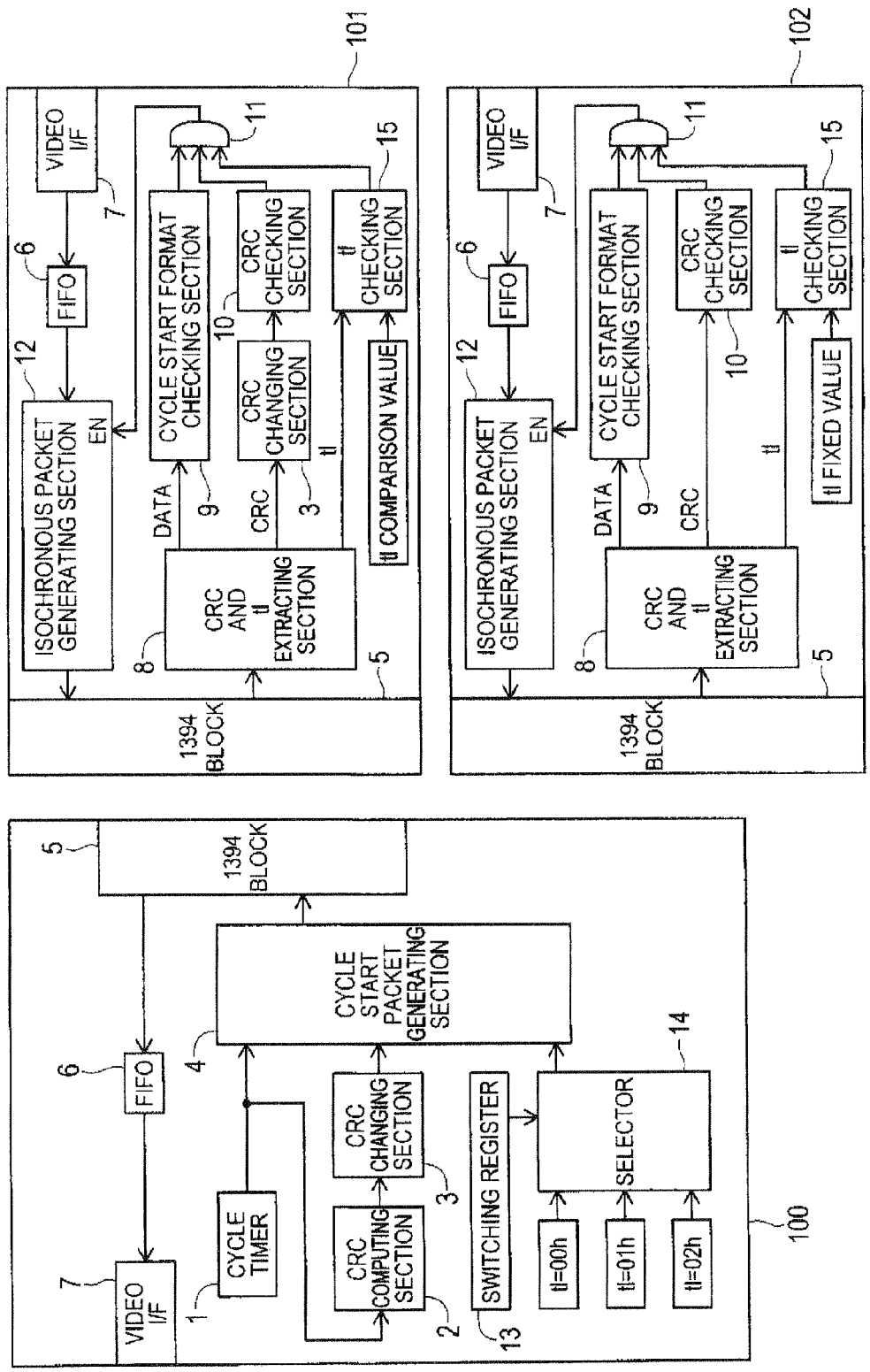
FIG. 5 is a block diagram of devices in a second embodiment.
Figure 6:
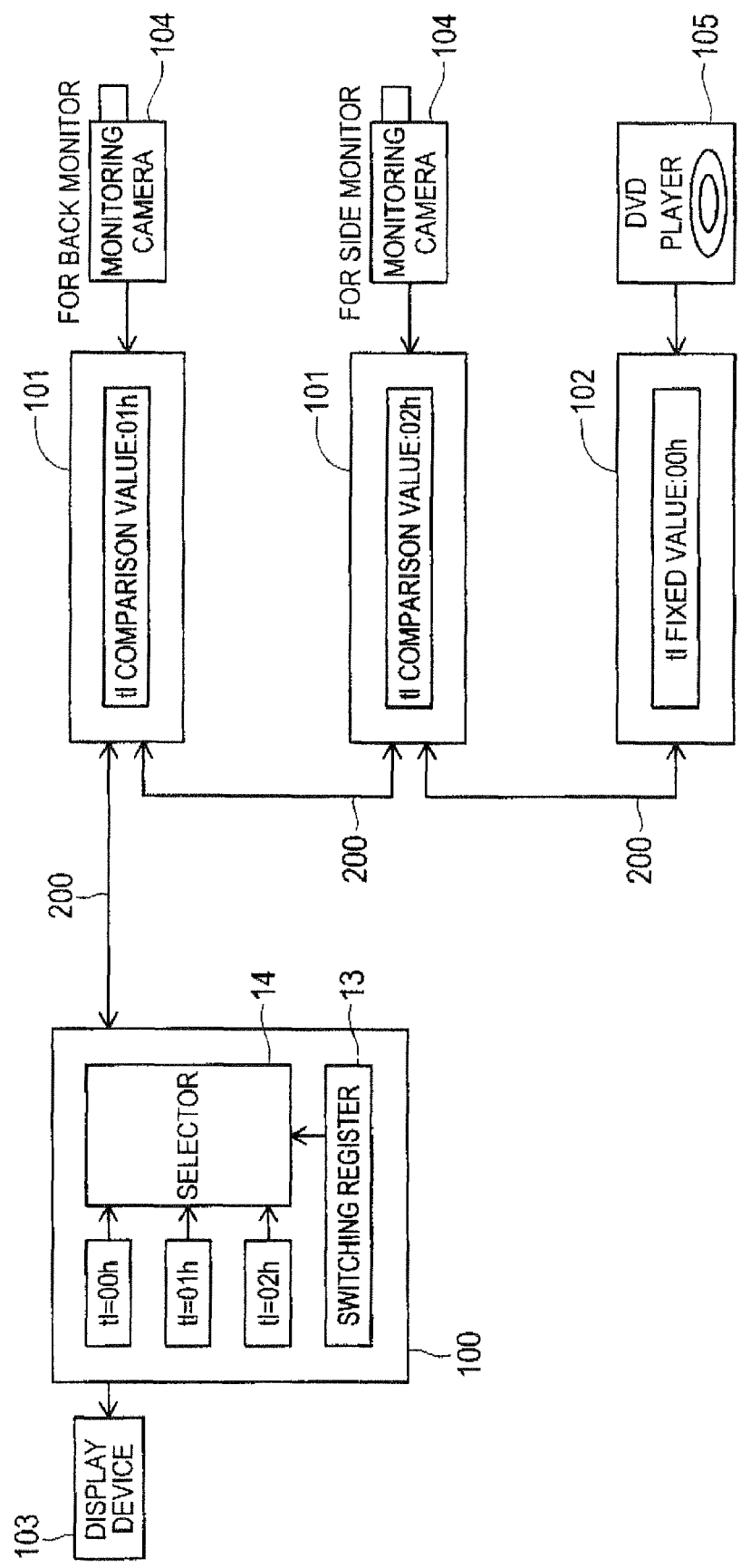
FIG. 6 is a block diagram illustrating connections in the second embodiment.

FIG. 5 is a block diagram of an isochronous packet receiving device 100 and isochronous packet transmitting devices 101 and 102 provided in a packet communication device according to a second embodiment. FIG. 6 is a block diagram illustrating connections in an in-vehicle network using the packet transmitting devices depicted in FIG. 5. The receiving device 100 and transmitting devices 101 and 102 are omitted in FIG. 6. The second embodiment will now be described based on FIG. 5 and FIG. 6.

In the second embodiment, the receiving device 100 has a switching register 13 and a selector 14 (refer to FIG. 5). The transmitting devices 101 and 102 each have a CRC and t1 extracting section 8 and t1 checking section 15. As the rest of the constituting elements are the same as in the first embodiment, further description thereof is hereby omitted. In an in-vehicle network using the packet communication device according to the second embodiment, the isochronous packet receiving device 100, the two isochronous packet transmitting devices 101 and the transmitting device 102 are connected through an IEEE 1394 bus 200 (refer to FIG. 6). A display device 103 is connected to the receiving device 100. Monitoring cameras 104 for a back monitor and a side monitor are respectively connected to the two transmitting devices 101. A DVD player 105 is connected to the transmitting device 102.

As was described earlier, a transaction label t1 is included in the components of the cycle start packet (refer to FIG. 21). The transaction label t1 represents a label for identifying each transaction. A fixed value 00h is included in conventional cycle start packets. In the second embodiment, a selector 14 can select either one of the fixed values 01h and 02h, other than the conventional fixed value 00h, with respect to transaction labels t1, based on a value set in the switching register 13 provided in the receiving device 100. Accordingly, the transaction labels t1 of the cycle start packets generated in the cycle start packet generating section 4 can be set to any of the fixed vales 00h, 01h and 02h.

In the transmitting devices 101 and 102, the cycle start packets to be transmitted from the receiving device 100 are inputted to the CRC and the t1 extracting section 8 through the 1394 block 5. The CRC and the t1 extracting section 8 extract a header_CRC and a transaction label t1 of the cycle start packet. In the second embodiment, the cycle start format checking section 9 checks the configuration of DATA representing data in the cycle start packet with the CRC and t1 removed therefrom. Also, the CRC checking section 10 checks for errors in the CRC data, and in addition, the t1 checking section 15 checks the transaction labels t1.

In conventional art, the transaction labels t1 are checked in the t1 checking section 15 by comparison with the fixed value 00h. However, in the second embodiment, the t1 checking section 15 provided in the transmitting device 101 receives a changeable comparison value. Accordingly, the transaction labels t1 are checked in the t1 checking section 15 provided in the transmitting device 101 by comparison with the changeable comparison value. As illustrated in FIG. 6, the transaction labels t1 are compared with the comparison value 01h in the transmitting device 101 connected to the monitoring camera 104 of the back monitor, and with the comparison value 02h in the transmitting device 101 connected to the monitoring camera 104 of the side monitor.

In the transmitting devices 101 and 102, the respective checking results of the cycle start format checking section 9, the CRC checking section 10 and the t1 checking section 15 are inputted to an AND gate 11. An output of the AND gate 11 is connected to an enable terminal EN of the isochronous packet generating section 12. Accordingly, if the respective checking results as processed in the cycle start format checking section 9, the CRC checking section 10 and the t1 checking section 15 are recognized as normal, enabling of the isochronous packet generating section 12 is asserted.

Operation in the second embodiment having the above-described configuration will now be described. If the CRC changing section 3 provided in the receiving section 100 normally outputs a through-side input, and the changing register 13 provided in the receiving device 100 is set so that selector 14 always selects the conventional fixed value 00h, the cycle start packets transmitted from the receiving device 100 are normal cycle start packets. Thus, the checking results with respect to the cycle start packets transmitted from the receiving device 100, as processed in the cycle start format checking section 9, the CRC checking section 10 and the t1 checking section 15 are recognized as normal in the transmitting device 102 which does not have the CRC changing section 3 and compares the transaction labels t1 with the fixed value 00h. Accordingly, enabling of the isochronous packet generating section 12 is asserted, enabling transfer of isochronous packets of video image data from the DVD player 105 to the IEEE 1394 bus 200.

Alternatively, the CRC changing section 3 provided in the two transmitting devices 101 are set so as to output an inverted-side input, as is the case with the first embodiment. The t1 checking sections 15 provided in the two transmitting devices 101 each compares the transaction labels t1 with the comparison values 01h and 02h. Thus, the checking results with respect to the cycle start packets transmitted from the receiving device 100, as processed in the CRC checking section 10 and the t1 checking section 15 are not recognized as normal in the two transmitting devices 101. Accordingly, enabling of the isochronous packet generating section 12 is not asserted, which disables transfer of isochronous packets of video image data in the respective monitoring cameras 103 of the back monitor and the side monitor to the IEEE 1394 bus 200. Only isochronous packets of video image data from the DVD player 105 are transferred to the IEEE 1394 bus 200, while the DVD video image data is outputted to the display device 103.

Here, once the display contents of the display device 103 for backing up a vehicle are switched to video images of the back monitor, settings of the CRC changing section 3 provided in the receiving device 100 are switched so as to output an inverted-side input. Also, settings of the switching register 13 provided in the receiving device 100 are switched so that the selector 14 selects the comparison value 01h. The cycle start packet generating section 4 provided in the receiving section 100 generates cycle start packets having an inverted header_CRC and value 01h included in the transaction labels t1. Accordingly, the cycle start packets transmitted from the receiving device 100 become cycle start packets having inverted CRC data and the transaction labels t1 set to 01h. As a result, the checking results with respect to the cycle start packets transmitted from the receiving device 100 as processed in the CRC checking section 10 and the t1 checking section 15 are not recognized as normal in the transmitting device 102 which does not have the CRC changing section 3 and compares the transaction labels t1 with the fixed value 00h. Accordingly, enabling of the isochronous packet generating section is not asserted, which stops transfer of the isochronous packets of video image data from the DVD player 105 to the IEEE 1394 bus 200.

Alternatively, as the CRC changing sections 3 provided in the two transmitting devices 101 are set so as to output inverted-side input, checking results with respect to cycle start packets transmitted from the receiving device 100 as processed in the CRC checking section 10 are recognized as normal in the two transmitting devices 101. The t1 checking sections 15 provided in the two transmitting sections 101 respectively compare the transaction labels t1 with the comparison values 01h and 02h. In the cycle start packets transmitted from the receiving section 100, the transaction labels t1 are set to 01h. Thus, the checking results as processed in the t1 checking section 15 are recognized as normal only in the transmitting device 101, from the two transmitting devices 101, which makes comparison with the comparison value 01h, specifically, only in the transmitting device 101 which is connected with the monitoring camera 104 of the back monitor. Accordingly, enabling of the isochronous packet generating section 12 is asserted only in the transmitting device 101 connected with the monitoring camera 104 of the back monitor. This enables transfer of isochronous packets of video image data of the monitoring camera 104 of the back monitor to the IEEE 1394 bus 200. Only isochronous packets of video image data of the monitoring camera 104 of the back monitor are transferred to the IEEE 1394 bus 200 in place of video image data of the DVD player 105, while video image data of the back monitor is outputted to the display device 103.

Similarly, once the display contents of the display device 103 are switched to video of a side monitor for pulling the vehicle over to the kerb, settings of the CRC changing section 3 provided in the receiving device 100 are switched so as to output inverted-side input. Settings of the switching register 13 provided in the receiving device 100 are switched so that the selector 14 will select the comparison value 02h. Accordingly, in this case, enabling of the isochronous packet generating section 12 is asserted only in the transmitting device 101 connected with the monitoring camera 104 of the side monitor. This enables transfer of isochronous packets of video image data in the monitoring camera 104 of the side monitor to the IEEE 1394 bus 200. Only isochronous packets of video image data of the monitoring camera 104 for the side monitor are transferred to the IEEE 1394 bus 200, while video image data of the side monitor is outputted to the display device 103.

Figure 7:
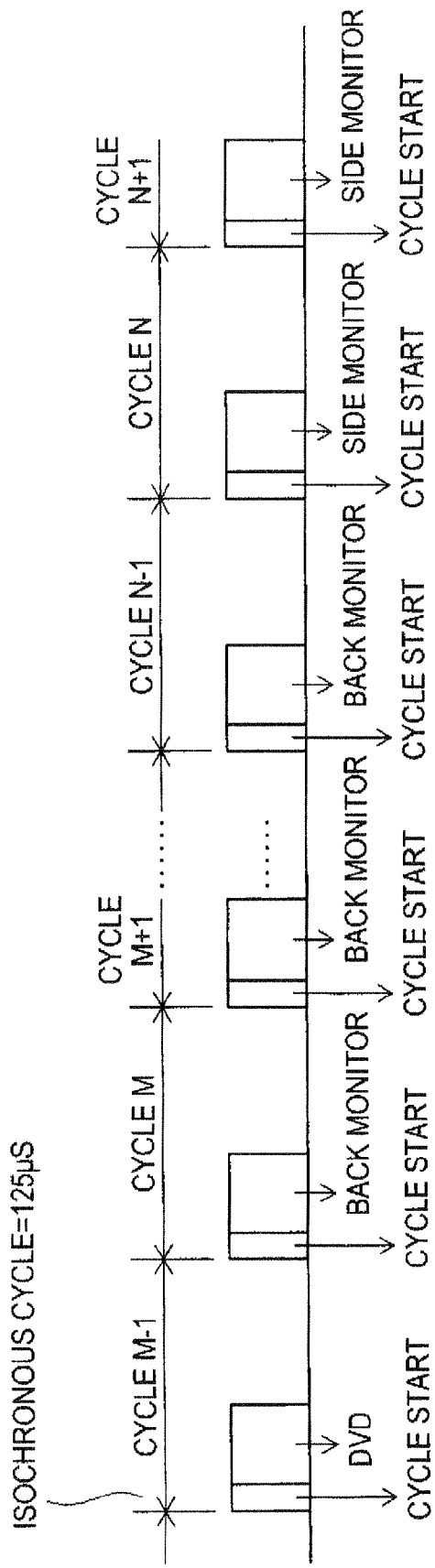
FIG. 7 depicts transfer of packets on the IEEE 1394 bus 200 in the second embodiment.
Figure 8:
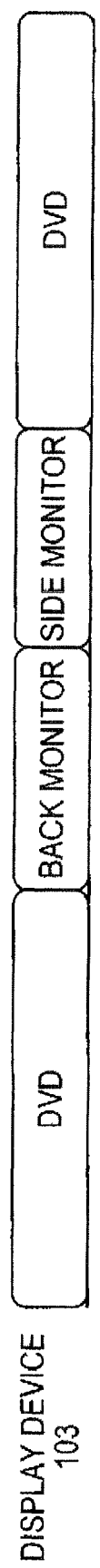
FIG. 8 depicts the display contents to be outputted to the display device 103 in the second embodiment.

FIG. 7 illustrates transfer of packets on the IEEE 1394 according to the second embodiment as described herein. FIG. 8 illustrates the display contents to be outputted to the display device 103. In the second embodiment as described above, the CRC changing section 3 provided in the receiving device 100 switches between the through side and the inverted side with respect to the CRC data of the cycle start packets to be transmitted from the receiving device 100. Also, settings can be made so that the selector 14 selects either of values 01h and 02h, other than the conventional fixed value 00h, in the switching register 13 provided in the receiving device 100, with respect to the transaction labels t1 of the cycle start packets transmitted from the receiving device 100. Enabling of the isochronous packet generating section 12 is asserted only at the transmitting device, of the two transmitting devices 101 and 102, which received the compliant cycle start packets, which enables transmission of isochronous packets. As a result, isochronous packets to be transferred on the IEEE 1394 bus 200 as illustrated in FIG. 7 can be switched without carrying out procedures such as band releasing and band reservation as is the case with the first embodiment. As a result, display contents of the display device 103 are outputted without interruptions between the respective video images of the DVD, the back monitor and the side monitor. Thus, as is the case with the first embodiment, bus band can be efficiently used, making it possible to suppress power consumption.

Further, in the second embodiment, the receiving device 100 has a switching register 13 and a selector 14 in addition to the CRC changing section 3. Here, three types of isochronous packets can be switched by changing the transaction labels t1 of the cycle start packets.

Figure 9:
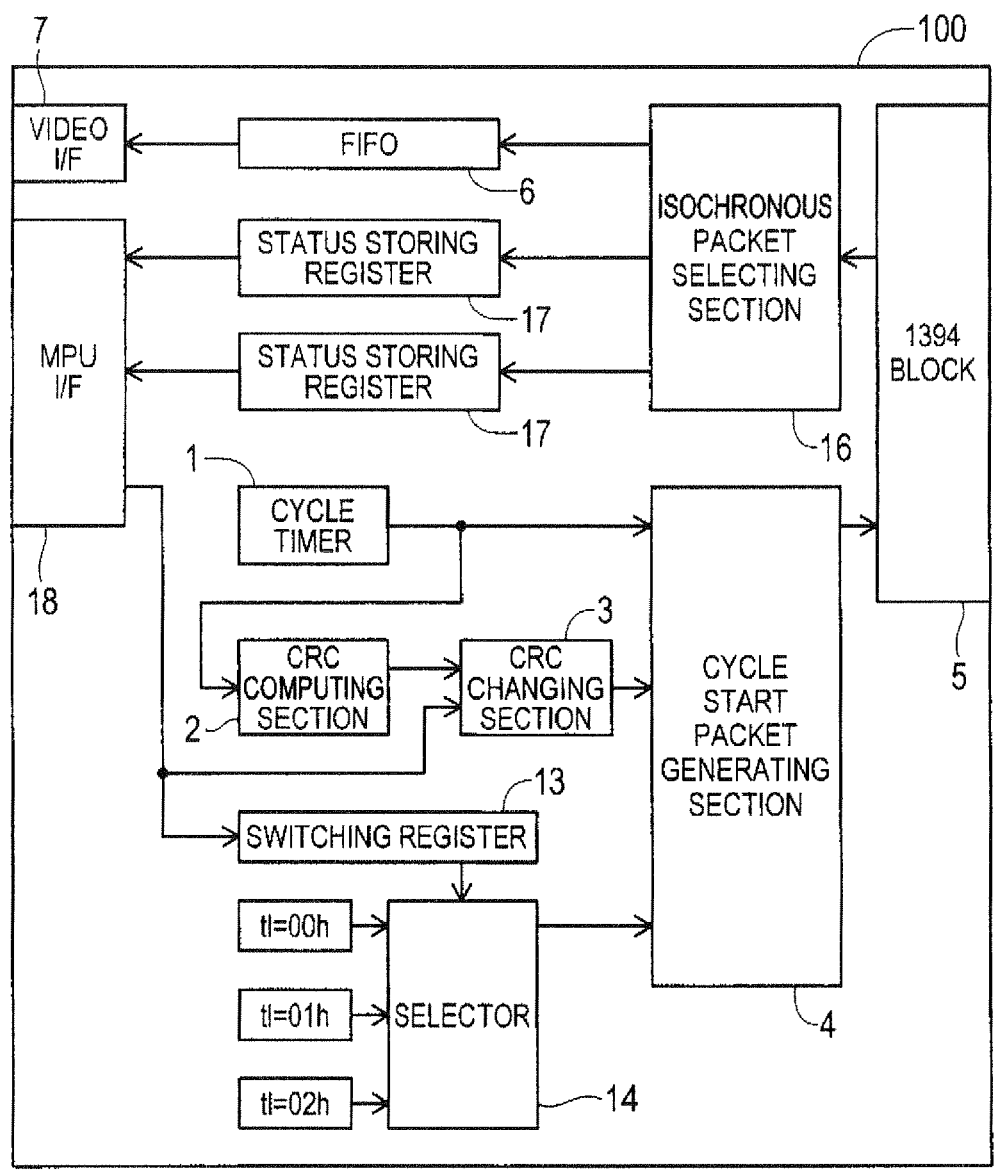
FIG. 9 is a block diagram of device in a third embodiment.
Figure 10:
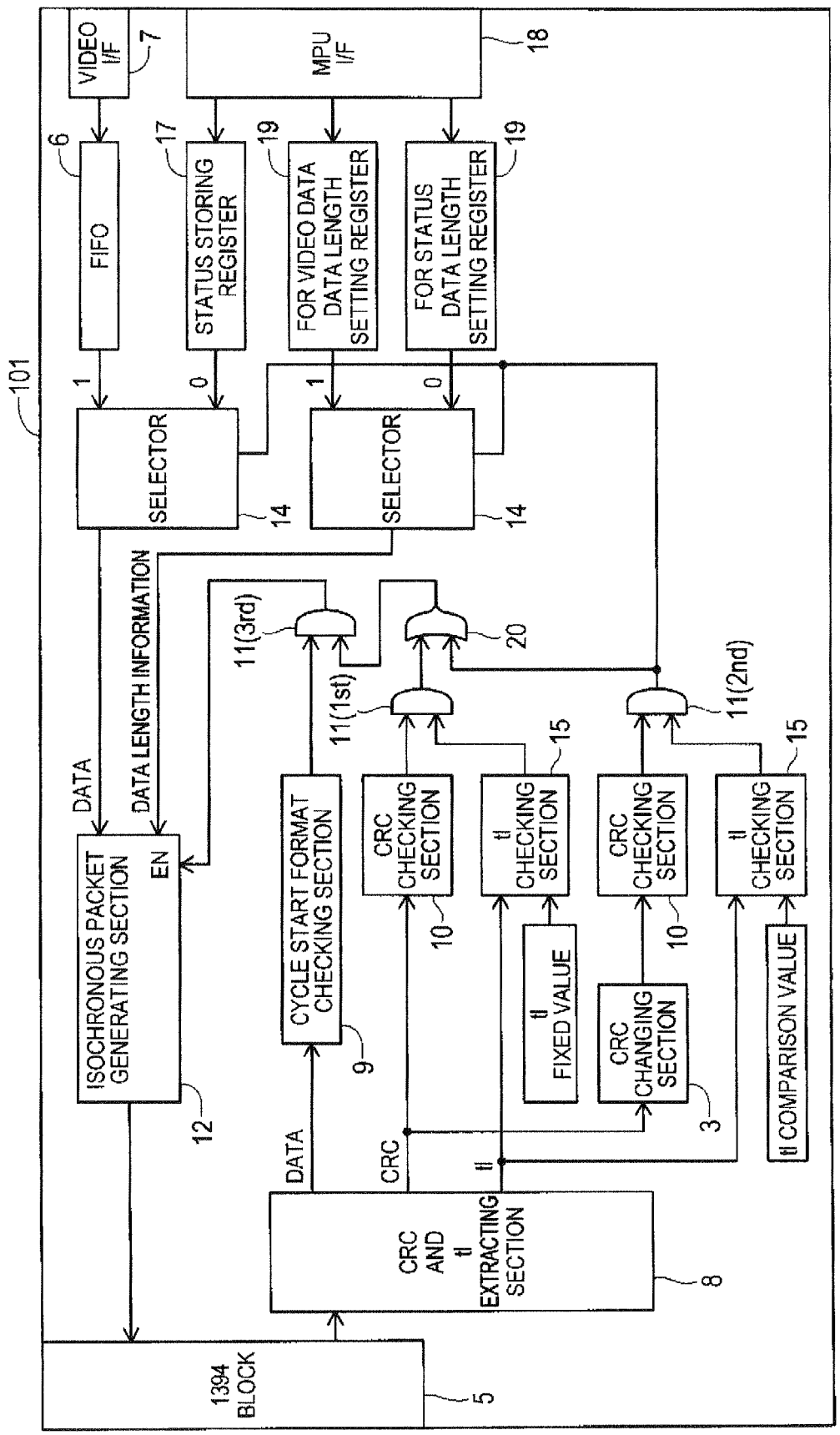
FIG. 10 is a block diagram of device in the third embodiment.
Figure 11:
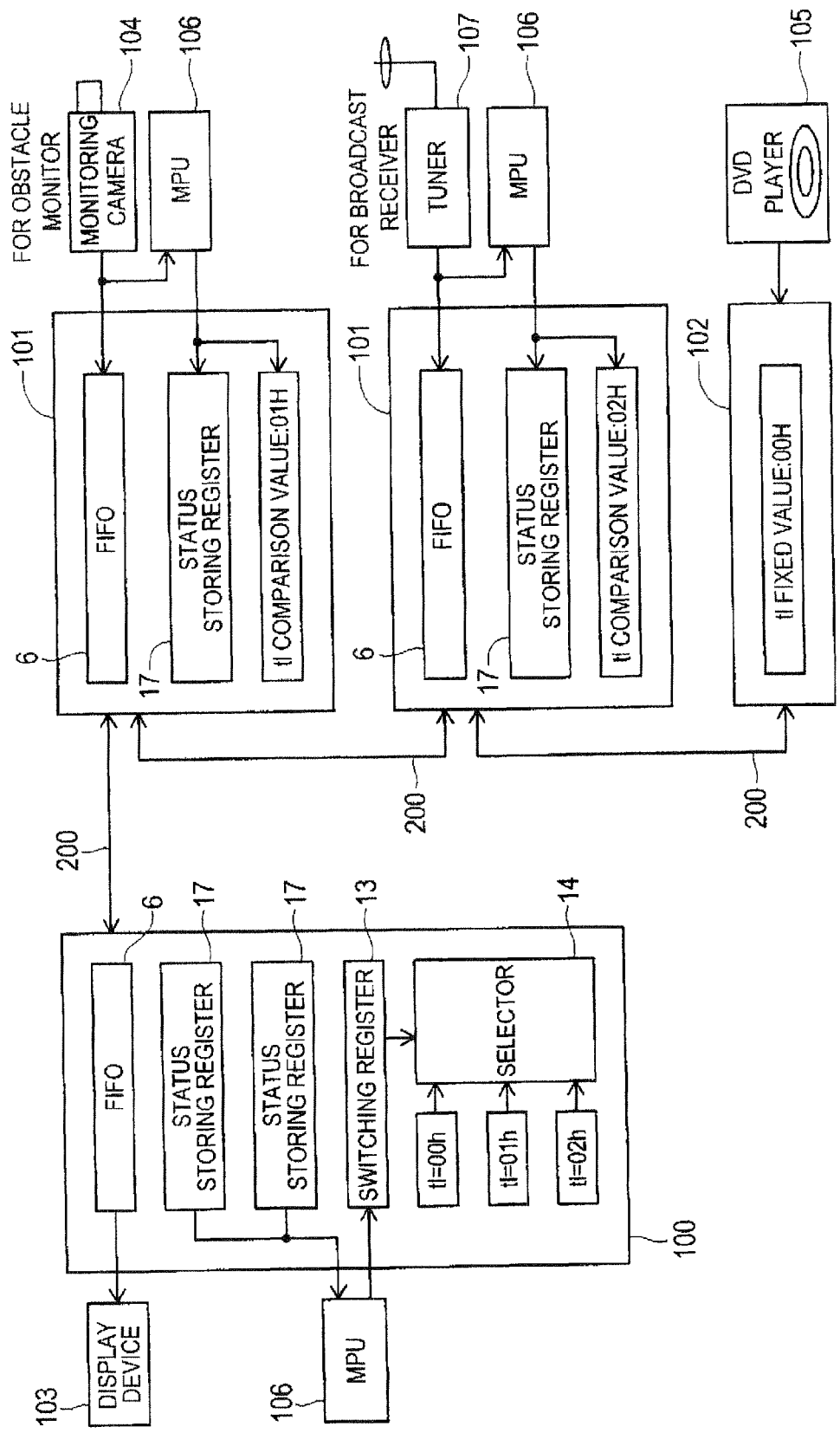
FIG. 11 is a block diagram illustrating connections in the third embodiment.

FIG. 9 illustrates a block diagram of an isochronous packet receiving device 100 in a packet communication device according to a third embodiment. FIG. 10 is a block diagram of an isochronous packet transmitting device 101 provided in a packet communication device according to the third embodiment. FIG. 11 is a block diagram illustrating connections in an in-vehicle network using the packet communication device depicted in FIG. 9 and FIG. 10. In FIG. 11, the receiving device 100 and the transmitting devices 101 and 102 are omitted. The third embodiment will now be described while referring to FIG. 9 through FIG. 11.

In the third embodiment, the receiving device 100 has an isochronous packet selecting section 16, two status storing registers 17 and an MPU_I/F 18 (refer to FIG. 9). The transmitting device 1031 has two CRC checking sections 10, two t1 checking sections 15, three AND gates 11, an OR gate 20, two selectors 14, an MPU_I/F 18, a status storing register 17, and two data length setting registers 19, one register being employed for video data and the other one being employed for status (refer to FIG. 10). The rest of the constituent elements are the same as those in the second embodiment, and therefore, further description thereof is hereby omitted. In an in-vehicle network using the packet communication device according to the third embodiment, the isochronous packet receiving device 100, the two transmitting devices 101 and the transmitting device 102 are connected through the IEEE 1394 bus 200 (refer to FIG. 11). A display device 103 and an MPU 106 are connected to the receiving device 100. A monitoring camera 104 of an obstacle monitor or a tuner 107 for a broadcast receiver and an MPU 106 are respectively connected to the two transmitting devices 101. A DVD player 105 is connected to the transmitting device 102.

The isochronous packets which are transferred from the respective transmitting devices through the IEEE 1394 bus 200 are inputted to the isochronous packet selecting section 16 through an 1394 block 5 provided in the receiving device 100 (refer to FIG. 9). The isochronous packet selecting section 16 outputs the isochronous packets thus received the FIFO 6 or the status storing register 17, in accordance with the contents of such packets. The isochronous packets inputted to the FIFO 6 are outputted to the display device 103 through the video I/F 7. Alternatively, isochronous packets inputted to the status storing register 17 are inputted to the MPU 106 through the MPU_I/F 18. The MPU 106 controls the CRC changing section 3 and the switching register 13 in accordance with the isochronous packets thus received.

The CRC data of the cycle start packets extracted in the CRC and the t1 extracting section 8 provided in the transmitting device 101 is inputted to one of the two CRC checking sections 10 directly, and to the other CRC checking section 10 through the CRC changing section 3 (refer to FIG. 10). The transaction labels t1 of the cycle start packets as extracted in the CRC and t1 extracting section 8 are compared with a fixed value 00h at one of the two t1 checking sections 15, and with a changeable comparison value at the other t1 checking section 15. The checking results as processed at the CRC checking section 10 to which CRC data is inputted directly, and the checking results as processed at t1 checking section 15 which makes comparison with the fixed value 00h are inputted to a first AND gate 11. Then, output of this AND gate 11 is inputted to the OR gate 20. Checking results of the CRC checking section 10 to which the CRC data is inputted through the CRC changing section 3 and checking results of the t1 checking section 15 which makes comparison with the comparison value are inputted to a second AND gate 11. Then, output of this AND gate 11 is inputted to the OR gate 20 and to the two selectors 14. Output of the OR gate 20 is inputted to a third AND gate 11, together with output of the cycle start format checking section 9. Output of the third AND gate 11 is inputted to an enable terminal EN of the isochronous packet generating section 12.

An MPU 106 is connected to the status storing register 17, and the two data length setting registers 19, one being employed for video data and the other one being employed for status, through the MPU_I/F 18 (refer to FIG. 10 and FIG. 11). One of the two selectors 14 receives video data from the FIFO 6 and status information from the status storing register 17. The other one of the two selectors 14 receives data length information from two data length setting registers 19, one being employed for video data and the other one being employed for status. The two selectors select which input to output, based on the output from the second AND gate 11. Outputs of the two selectors 14 are inputted to the isochronous packet generating section 12, where isochronous packets are generated.

As illustrated in FIG. 11, of the two transmitting devices 101, the transmitting device 101 connected to the monitoring camera 104 employed for the obstacle monitor has a comparison value 01h, and the transmitting device 101 connected to the tuner 107 for the broadcast receiver has a comparison value 02h as comparison values for the transaction labels t1. The MPU 106 to which the two transmitting devices 101 are respectively connected is connected with a monitoring camera 104 of the obstacle monitor and a tuner 107 for the broadcast receiver, respectively. The MPU 106 monitors the status of the respective input devices.

The operation of the third embodiment having the above-described configuration will now be described. The CRC changing section 3 provided in the receiving device 100 normally receives a through-side input and the switching register 13 provided in the receiving device 100 is set so that the selector 14 will select the conventional fixed value 00h. In this case, cycle start packets to be transmitted from the receiving device 100 are normal cycle start packets. As a result, the checking results with respect to the cycle start packets to be transmitted from the receiving device 100, as processed in the cycle start format checking section 9, the CRC checking section 10 and the t1 checking section 15 are recognized as normal in the transmitting device 102 which does not have the CRC changing section 3 and compares the transaction labels t1 with the fixed value 00h. Accordingly, enabling of the isochronous packet generating section is asserted, which enables transfer of the isochronous packets of video image data from the DVD player 105 to the IEEE 1394 bus 200.

Alternatively, in the two transmitting devices 101, checking results as processed in the CRC checking section 10 to which the CRC data is inputted directly and checking results of the t1 checking section 15 which makes comparison with the fixed value 00h are recognized as normal (refer to FIG. 10 and FIG. 11). However, the CRC changing section 3 is set so as to receive inverted-side input, as is the case with the second embodiment. Thus, the checking results as processed in the CRC checking section 10 to which CRC data is inputted through the CRC changing section 3 and the checking results of the t1 checking section 15 which makes comparison with the comparison value are not recognized as normal. Accordingly, a first AND gate 11 and a second AND gate 11 output 1 and 0, respectively. Upon receiving checking results from the a cycle start format checking section 9 and the output (=1) from the OR gate 20, a third AND gate 11 outputs 1, and enabling of the isochronous packet generating section 12 is asserted.

As the output of the second AND gate 11 is 0, two selectors 14 select and then output status information from the respective status storing register 17 and data length information from the data length setting register 19 for status Accordingly, isochronous packets of status information are generated in the isochronous packet generating section 12.

As a result, video image data of the DVD player 105, status information from the monitoring camera 104 for the obstacle monitor and status information from the tuner 107 for the broadcast receiver are transferred in isochronous packets to the IEEE 1394 bus 200. In the receiving device 100, DVD video image data is outputted to the display device 103, while status information from the monitoring camera 104 of the obstacle monitor and the tuner 107 of the broadcast receiver is separately stored in the two status storing registers 17.

Here, once the MPU 106 connected to the monitoring camera 104 of the obstacle monitor detects obstacle proximity, the status storing register 17 inside the transmitting device 101 connected to the monitoring camera 104 of the obstacle monitor is updated. Contents of the register are transferred to the IEEE 1394 bus 200 as isochronous packets and are then received at the receiving device 100. These contents are then notified to the MPU 106 connected to the receiving device 100. The MPU 106 at which the notification is received switches settings of the CRC changing section 3 provided in the receiving device 100 so as to output an inverted-side input. Settings of the switching register 13 provided in the receiving device 100 are switched by the MPU 106 so that the selector 14 will select the comparison value 01h. Thus, the cycle start packet generating section 4 provided in the receiving device 100 generates cycle start packets having inverted header-_CRC attached thereto and having transaction labels t1 including value 01h. Accordingly, as is the case with the second embodiment, the checking results as processed in the CRC checking section 10 and the t1 checking section 15 are not recognized as normal in the transmitting device 102. Accordingly, enabling of the isochronous packet generating section 12 is not asserted in the transmitting device 102, which stops transfer of isochronous packets of video image data from the DVD player 105 to the IEEE 1394 bus 200.

Alternatively, checking results of the CRC checking section 10 to which CRC data is inputted directly and checking results of the t1 checking section 15 making comparison with the fixed value 00h or the comparison value 02h are not recognized as normal in the two transmitting devices 101. However, checking results of the CRC checking section 10 to which the CRC data is inputted through the CRC changing section 3 and checking results of the t1 checking section 15 which makes comparison with the comparison value 01h are recognized as normal (refer to FIG. 10 and FIG. 11). Accordingly, enabling of the isochronous packet generating section 12 is asserted only at the transmitting device 101, of the two transmitting devices 101, which makes comparison with the comparison value 01h, specifically, only at the transmitting device 101 which is connected with the monitoring camera 104 of the obstacle monitor.

At this time, the output of the second AND gate 11 provided in the transmitting device 101 connected with the monitoring camera 104 of the obstacle monitor is 1. Thus, the two selectors 14 select and output video data from the respective FIFO 6 and data length information from the data length setting register 19 for video data. Accordingly, the isochronous packet generating section 12 generates isochronous packets of video data of the obstacle monitors in place of stats information.

As a result, only isochronous packets of video data of the obstacle monitor are transferred to the IEEE 1394 bus 200. In the receiving device 100, the video data of the obstacle monitor is outputted to the display device 103. Thereafter, if the obstacle is avoided and the display contents of the display device 103 are switched again to the DVD video image, cycle start packets to be transmitted from the receiving device 100 will be switched back to normal cycle start packets. As a result, this makes it possible to enjoy watching the DVD again.

Similarly, if the MPU 106 connected to the tuner 107 of the broadcast receiver detects emergency information such as occurrence of an earthquake and the like, the status storing register 17 provided in the transmitting device 101 connected to the tuner 107 of the broadcast receiver is updated. The contents of the register are transferred to the IEEE 1394 bus 200 as isochronous packets and are received at the receiving device 100. Then, a notification is transmitted to the MPU 106 connected to the receiving device 100. The MPU 106 which received such notification switches the settings of the CRC changing section 3 provided in the receiving device 100 so as to output an inverted-side input. Thus, the MPU 106 switches the settings of the switching register 13 provided in the receiving device 100 so that the selector 14 selects the comparison value 02h. Accordingly, in this case, enabling of the isochronous packet generating section 12 is asserted only at the transmitting device 101 connected with the tuner 107 of the broadcast receiver 107, enabling generation of isochronous packets of video data for the broadcast receiver.

As a result, only isochronous packets of video data for the broadcast receiver will be transferred to the IEEE 1394 bus 200. In the receiving device 100, video data of the broadcast receiver is outputted to the display device 103. Thereafter, once emergency information is terminated and the display contents on the display device 103 are switched again to DVD video image, cycle start packets which are transmitted from the receiving device 100 are switched back to normal cycle start packets, making it possible to enjoy watching the DVD again.

Figure 12:
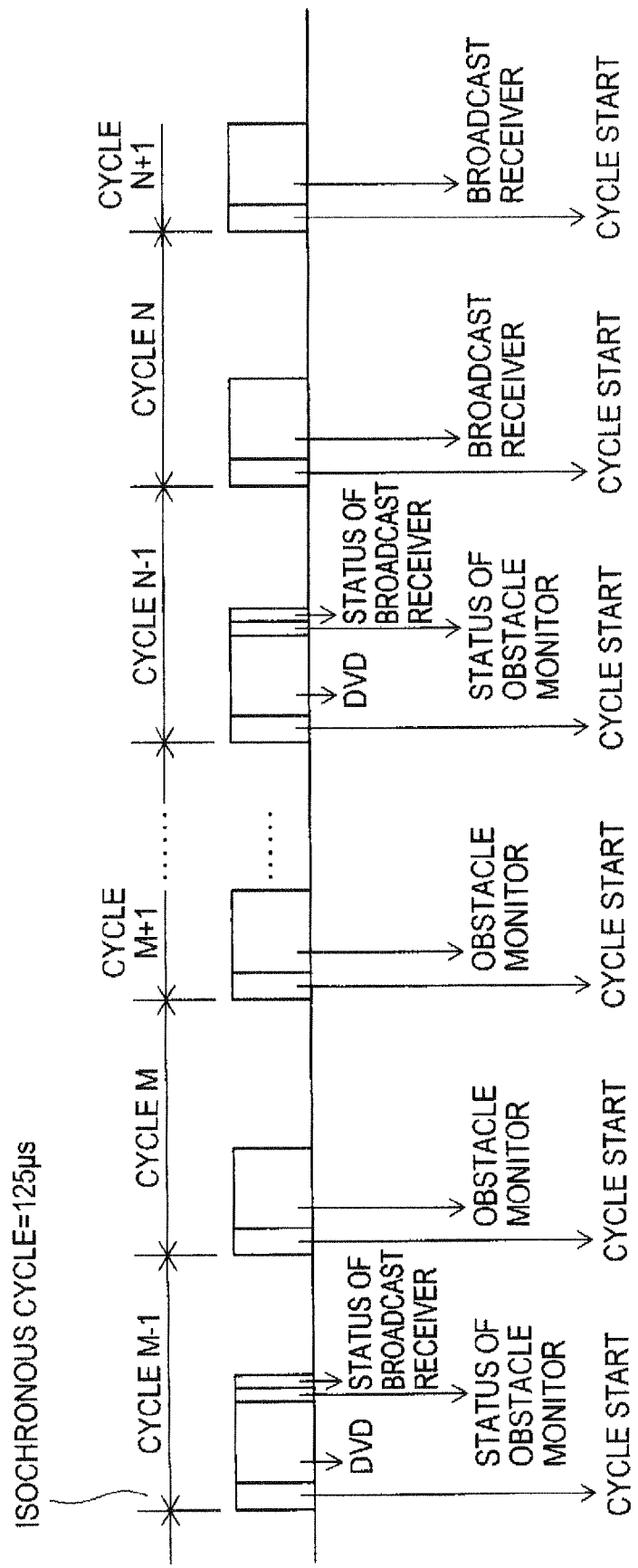
FIG. 12 depicts transfer of packets on the IEEE 1394 bus 200 in the third embodiment.
Figure 13:
FIG. 13 depicts the display contents to be outputted to the display device 103 in the third embodiment.

FIG. 12 illustrates transfer of packets on the IEEE 1394 bus 200 in the third embodiment as described hereinbefore. FIG. 13 illustrates display contents to be outputted to the display device 103. In the third embodiment as described above, the receiving device 100 and the transmitting device 101 have a status storing register 17 which stores status information of the input device and an MPU 106 which is connected to such status storing register 17. As a result, the transmitting device 101 can normally transfer only isochronous packets of status information of the input device. However, when proximity to an obstacle is detected, the transmitting device 101 can transfer isochronous packets of video data of the input device (refer to FIG. 12). As the size of the status information is smaller as compared to video data, the operating band of the bus can be normally suppressed for efficient usage of the bus band. At the same time, the size of the packets to be transferred can be reduced, which reduces power consumption. Further, switching of the cycle start packets can be controlled based on the notification from the transmitting devices 101 connected to the respective input devices. Accordingly, isochronous packets to be transferred can thus be switched, making it possible to output display contents of the display device 103 without interruptions (refer to FIG. 13).

Figure 14:
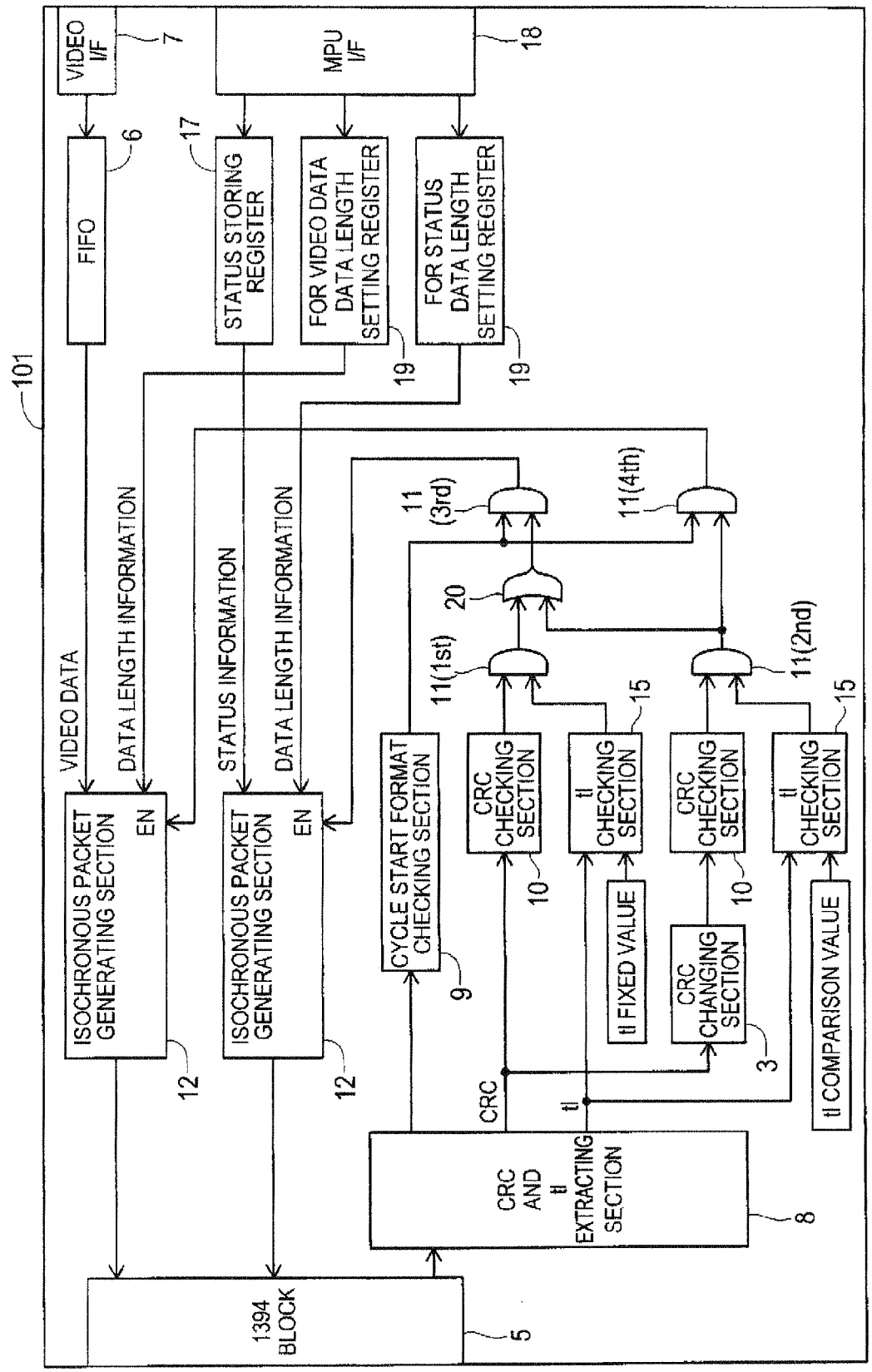
FIG. 14 is a block diagram of device in a fourth embodiment.

FIG. 14 illustrates a block diagram of an isochronous packet transmitting device 101, in a packet communication device according to a fourth embodiment. The fourth embodiment will be described while referring to FIG. 14.

The fourth embodiment differs from the third embodiment in that the transmitting device 101 does not have two selectors 14, but has two isochronous packet generating devices 12 and four AND gates 11. The rest of the constituent elements are the same as those in the third embodiment, and therefore, further description thereof is hereby omitted. Description in the fourth embodiment focuses on the points which differ from the third embodiment. In the third embodiment, the output of a second AND gate 11 is inputted to an OR gate 20 and to the two selectors 14 (refer to FIG. 10). In the fourth embodiment, the output of the second AND gate 11 is inputted to the OR gate 20 and to a fourth AND gate 11 thus added, without being inputted to the two selectors 14 (refer to FIG.

14). The fourth AND gate 11 further receives the output of the cycle start format checking section 9. Of the two isochronous packet generating sections 12, the output of the third AND gate 11 is inputted to the enable terminal EN of one of the isochronous packet generating sections 12, while the output of the fourth AND gate 11 is inputted to the enable terminal EN of the other isochronous packet generating section 12.

The isochronous packet generating section 12 connected to the third AND gate 11 receives status information from a status storing register 17 and data length information from a data length setting register 19 for status. The isochronous packet generating section 12 connected to the fourth AND gate 11 receives video data from the FIFO 6 and data length information from a data length setting register 19 for video data. The two isochronous packet generating sections 12 respectively generate isochronous packets of status information and video data.

The operation in the fourth embodiment as described earlier will now be described. The receiving device 100 and the transmitting device 102 are the same as the third embodiment. Normally, normal cycle start packets are transmitted from the receiving device 100. Enabling of the isochronous packet generating section 12 is asserted in the transmitting device 102, enabling transfer of isochronous packets of video image data from the DVD player 105 to the IEEE 1394 bus 200.

Alternatively, in the two transmitting devices 101, the first AND gate 11 outputs 1, the second AND gate 11 outputs 0 and the OR gate 20 outputs 1, as is the case with the third embodiment (refer to FIG. 14). Thus, the third AND gate 11 outputs 1 and the fourth AND gate 11 outputs 0. Accordingly, enabling of the isochronous packet generating section 12 to which the third AND gate 11 is connected, specifically, the isochronous packet generating section 12 which receives status information from the status storing register 17 and data length information from the data length setting register 19 for status is asserted.

As a result, isochronous packets of video image data of the DVD player 105, status information from the monitoring camera 104 of the obstacle monitor and status information from the tuner 107 of the broadcast receiver is normally transferred to the IEEE 1394 bus 200, as is the case with the third embodiment. In the receiving device 100, the video image data from the DVD is outputted to the display device 103 and status information from the monitoring camera 104 of the obstacle monitor and the tuner 107 of the broadcast receiver is separately stored in two status storing registers 17.

Here, once the MPU 106 connected to the monitoring camera 104 for the obstacle monitor detects proximity to an obstacle, the status storing register 17 provided inside the transmitting device 101 connected to the monitoring camera 104 of the obstacle monitor is updated. Thus, similarly with the third embodiment, cycle start packets having inverted leader_CRC attached thereto and transaction labels t1 including value 01h are outputted from the receiving device 100. Accordingly, enabling of the isochronous packet generating section 12 is not asserted in the transmitting device 102, which stops transfer of the isochronous packets of video image data from the DVD player 105 to the IEEE 1394 bus 200.

Alternatively, enabling of the isochronous packet generating section 12 is asserted only at the transmitting device 101, from the two transmitting devices 101, which makes comparison with the comparison value 01h, specifically, the transmitting device 101 which is connected with the monitoring camera 104 of the obstacle monitor, as is the case with the third embodiment. In the transmitting device 101 connected with the monitoring camera 104 of the obstacle monitor, the output of the first AND gate 11 is 0, while the output of the second AND gate 11 is 1. Thus, the output of the OR gate 20 is 1, the output of the third AND gate 11 and the output of the fourth AND gate 11 are both 1. Accordingly, enabling of both the isochronous packet generating section 12 connected to the third AND gate 11 and the isochronous packet generating section 12 connected to the fourth AND gate 11 is asserted.

Thus, isochronous packets of status information are transferred from the monitoring camera 104 of the obstacle monitor, in addition to the isochronous packets of video data of the obstacle monitor, to the IEEE 1394 bus 200. In the receiving device 100, video data of the obstacle monitor is outputted to the display device 103 and status information from the monitoring camera 104 of the obstacle monitor is stored in the status storing register 17. Status information from the monitoring camera 104 of the obstacle monitor as stored in the status storing register 17 is monitored by the MPU 106 connected to the receiving device 100. Thus, once it is detected that the obstacle was avoided and the normal state is restored, the cycle start packets are switched back to the normal cycle start packets. Specifically, the display contents of the display device 103 can be automatically switched back to the original DVD video image data. For instance, this is the same for the case that the MPU 106 connected to the tuner 107 of the broadcast receiver detects emergency information such as occurrence of earthquakes or the like.

Figure 15:
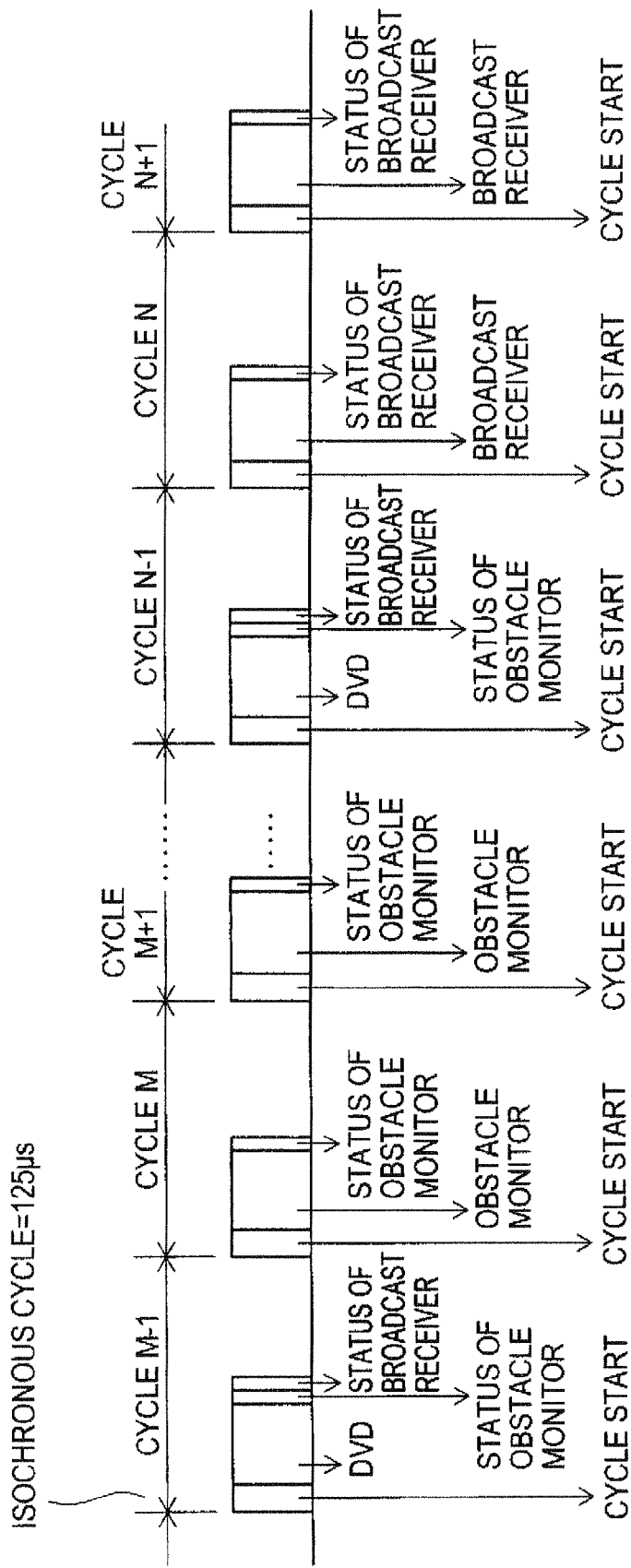
FIG. 15 depicts transfer of packets on the IEEE 1394 bus 200 in the fourth embodiment.

FIG. 15 illustrates transfer of packets on the IEEE 1394 bus 200 in the fourth embodiment as described hereinbefore. In the fourth embodiment as described hereinbefore, the transmitting device 101 has two isochronous packet generating sections 12 and four AND gates 11, in place of the two selectors 14. As a result, the transmitting device 101 normally transfers isochronous packets of status information of the input device. Alternatively, when proximity of an obstacle is detected, the transmitting device 101 can transfer isochronous packets of status information of the input device, in addition to isochronous packets of video data of the input device (refer to FIG. 15). Switching of the cycle start packets can be controlled based on the notification from the transmitting device 101 connected to each input device. Thus, it can be detected that the normal state is restored. Accordingly, the display contents of the display device 103 can be automatically restored to the original state.

Figure 16:
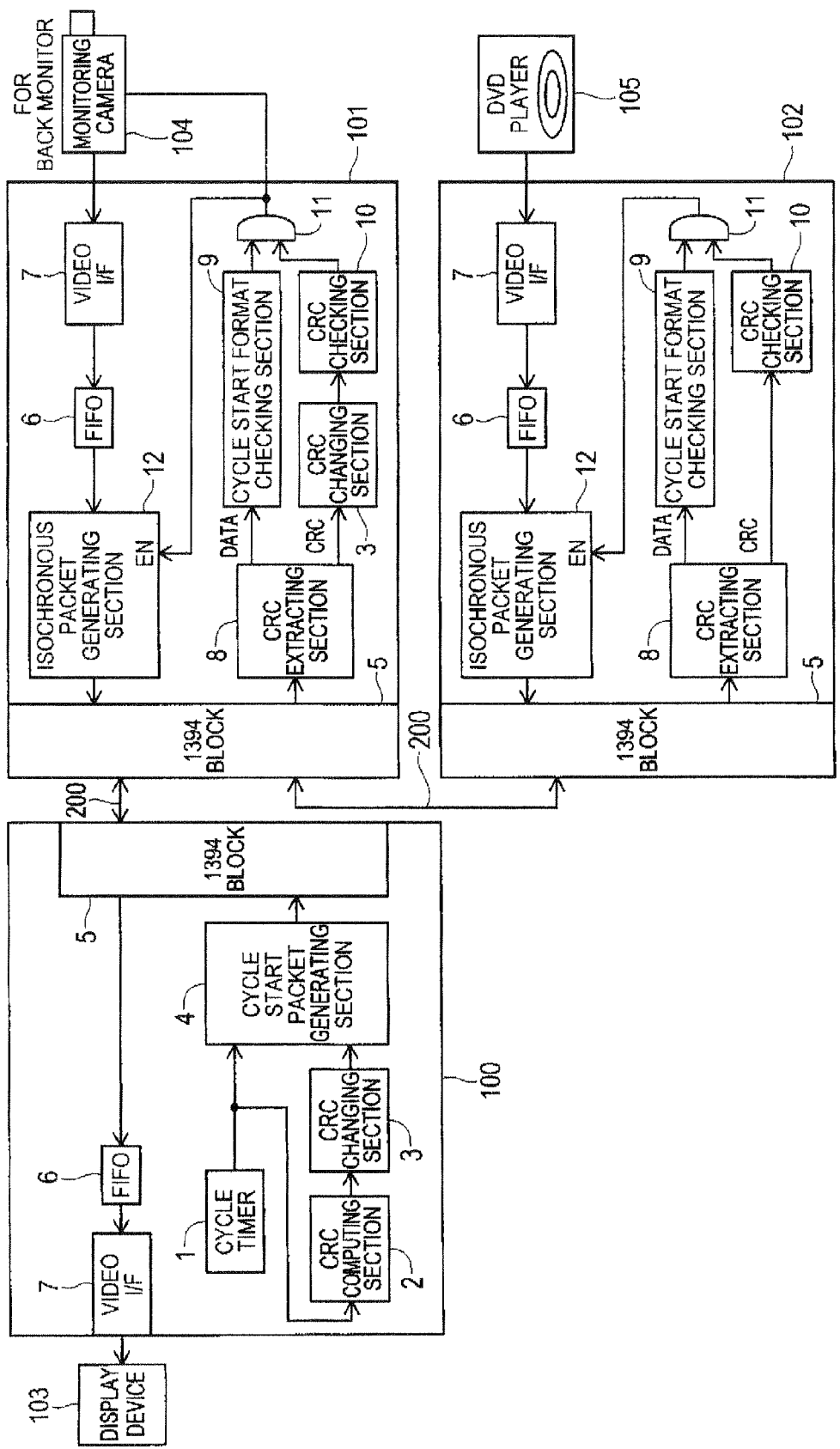
FIG. 16 is a block diagram illustrating connections in a fifth embodiment.

FIG. 16 is a block diagram illustrating connections in an in-vehicle network using a packet communication device according to a fifth embodiment. The fifth embodiment is similar with the first embodiment as described above, other than the fact that an output of an AND gate 11 provided in a transmitting device 101 is connected to a monitoring camera 104 of a back monitor. Thus, the characteristics of the fifth embodiment will now be described.

In the fifth embodiment, the output of the AND gate 11 provided in the transmitting device 101 is inputted to the monitoring camera 104 of the back monitor. Accordingly, the monitoring camera 104 can be set to be turned on only when isochronous packets of video image data for the monitoring camera 104 of the back monitor are transmitted to the IEEE 1394 bus 200. If DVD video image data is outputted to the display device 103 and the video image data of the back monitor is riot outputted to the display device 103, the monitoring camera 104 of the back monitor is set to a low-power-consumption mode, further suppressing power consumption.

Figure 17:
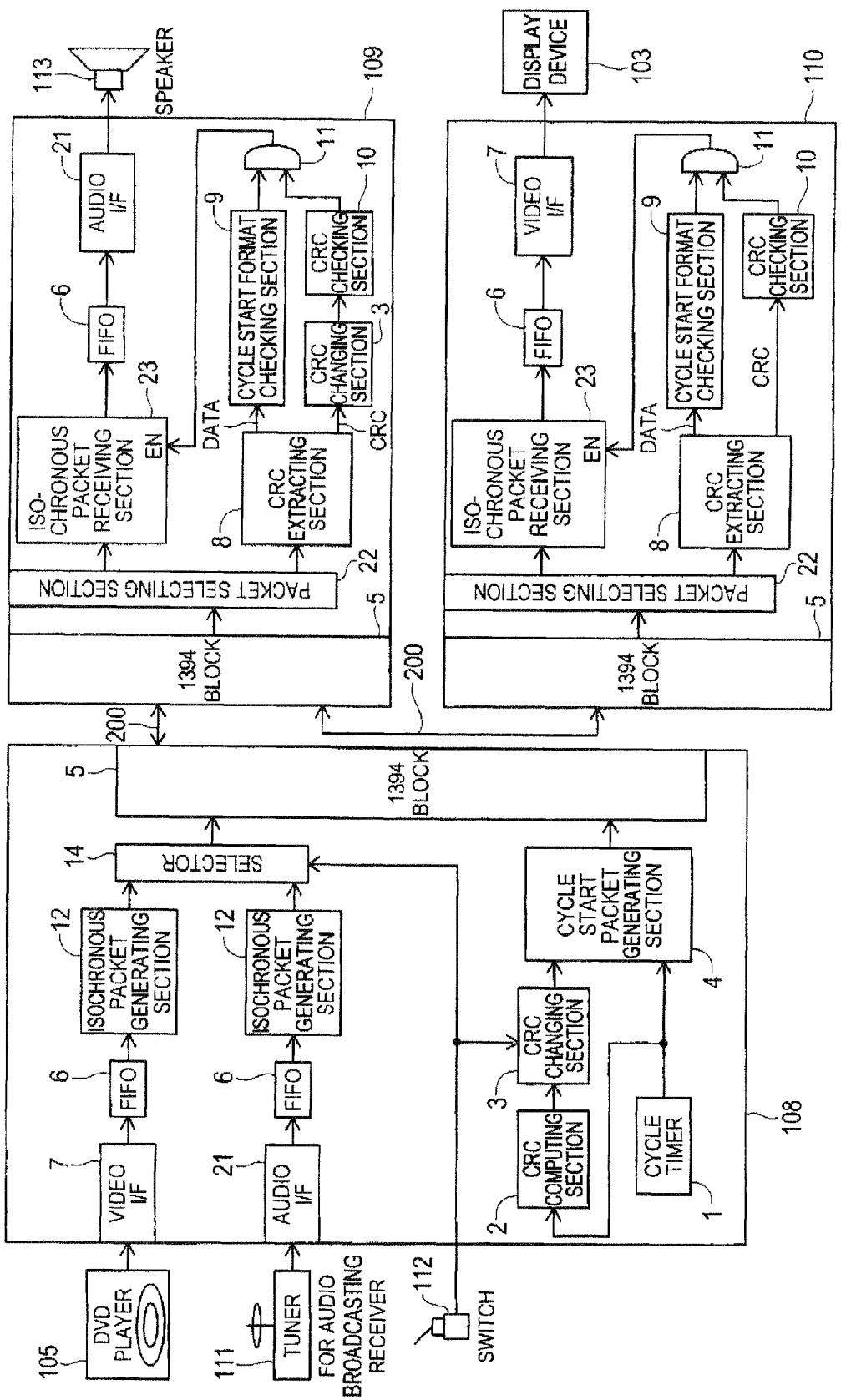
FIG. 17 is a block diagram illustrating connections in a sixth embodiment.

Insofar, examples were described in the first through fifth embodiments wherein cycle start packets are transmitted from an isochronous packet transmitting device. In a sixth embodiment, an example is described wherein cycle start packets are transmitted from an isochronous packet transmitting device. FIG. 17 is a block diagram depicting connections in an in-vehicle network using a packet communication device according to a sixth embodiment. An isochronous packet transmitting device 108 and isochronous packet receiving devices 109 and 110 are connected through an IEEE 1394 bus 200.

The transmitting device 108 has a cycle timer 1, a CRC computing section 2, a CRC changing section 3, a cycle start packet generating section 4, a 1394 block 5, a video I/F 7, an audio I/F 21, two FIFO 6, two isochronous packet generating sections 12 and a selector 14. The cycle timer 1, the CRC computing section 2, the CRC changing section 3 and generation of the cycle start packets in the cycle start packet generating section 3 are the same as described in the above text. The cycle start packets thus generated are transmitted on the IEEE 1394 bus 200 through the 1394 block 5, for transfer to the receiving devices 109 and 110.

A DVD player 105 is connected to the transmitting device 108 and isochronous packets of DVD video image data are generated in the isochronous packet generating section 12 through the video I/F 7 and the FIFO 6. A tuner 111 of an audio broadcasting receiver is connected to the transmitting device 108, and isochronous packets of audio data of the audio broadcasting receiver are generated in the isochronous packet generating section 12 through the audio I/F 21 and the FIFO 6. Isochronous packets thus generated in the respective isochronous packet generating sections 12 are inputted to the selector 14.

A switch 112 is provided. The switch 112 is switched so that the CRC changing section 3 provided in the transmitting device 108 can switch between outputting a through side output and an inverted side output. Also, by switching the switch 112, the selector 14 can switch between selecting and outputting isochronous packets from either one of the two isochronous packet generating sections 12.

The receiving devices 109 and 110 each have a 1394 block 5, a packet selecting section 22, a CRC extracting section 8, a cycle start format checking section 9, a CRC checking section 10, and an AND gate 11, an isochronous packet receiving section 23, a FIFO 6, an audio I/F 21 or a video I/F 7. The receiving device 109 further has a CRC changing section 3 which is set so as to output an inverted-side input. A speaker 113 is connected to the receiving device 109. Alternatively, a display device 103 is connected to the receiving device 110. Cycle start packets and isochronous packets transferred from the transmitting device 108 through the IEEE 1394 bus 200 are inputted to the packet selecting section 22 through the 1394 block 5 in the receiving devices 109 and 110, respectively. Cycle start packets are outputted to the CRC extracting section 8, while isochronous packets are outputted to the isochronous packet receiving section 23.

Cycle start packets to be inputted to the CRC extracting section 8 are checked by a cycle start format checking section 9 and a CRC checking section 10, as described above. The checking results are inputted to the AND gate 11 and an output of the AND gate 11 is connected to an enable terminal EN of the isochronous packet receiving section 23. Thus, if the checking results of the cycle start format checking section 9 and the CRC checking section 10 are recognized as normal, enabling of the isochronous packet receiving section 23 is asserted. Once enabling of the isochronous packet receiving section 23 is asserted, isochronous packets transmitted from the transmitting device 108 are outputted to the speaker 113 or the display device 103 through the FIFO 6, and the audio I/F 21 or video I/F 7.

Operation of the sixth embodiment as described above will now be described. The example described herein refers to the case that the switch 112 is set so that the CRC changing section 3 provided in the transmitting device 108 outputs a through-side input and, so that, of the two isochronous packet generating sections 12, the selector 14 outputs isochronous packets of the DVD player 105. In this case, normal cycle start packets and isochronous packets of DVD video image data are transferred to the IEEE 1394 bus 200. Thus, checking results with respect to the cycle start packets which are transmitted from the transmitting device 108, as processed in the cycle start format checking section 9 and the CRC checking section 10 are recognized as normal in the receiving device 110 which does not have the CRC changing section 3. Accordingly, enabling of the isochronous packet receiving section 23 is asserted in the receiving device 110, enabling output of isochronous packets of video image data from the DVD player 105 to the display device 103.

Alternatively, the CRC changing section 3 provided in the receiving device 109 is set so as to receive an inverted-side input. Thus, checking results with respect to the cycle start packets which are transmitted from the transmitting device 108, as processed in the CRC checking section 10 are not recognized as normal in the receiving device 109 which has the CRC changing section 3. Accordingly, enabling of the isochronous packet receiving section 23 is not asserted in the receiving device 109, disabling reception of isochronous packets of video image data from the DVD player 105 and output thereof to the speaker 113.

The example described herein refers to the case that, in order to listen to music on the radio, the switch 112 is switched so that the CRC changing section 3 provided in the transmitting device 108 outputs an inverted-side input, and the selector 14 outputs isochronous packets for the tuner 111 of the audio broadcasting receiver, of the two isochronous packet generating sections 12. In this case, cycle start packets having inverted CRC data and isochronous packets of audio data from the audio broadcasting receiver are transferred to the IEEE 1394 bus 200. Thus, the checking results with respect to the cycle start packets transmitted from the transmitting device 108, as processed in the CRC checking section 10, are not recognized as normal in the receiving device 110 which does not have the CRC changing section 3. Accordingly, enabling of the isochronous packet receiving section 23 is not asserted in the receiving device 110, disabling reception of isochronous packets of audio data from the tuner 111 of the audio broadcasting receiver and stopping output thereof to the display device 103.

Alternatively, as the CRC changing section 3 provided in the receiving device 109 is set so as to output an inverted-side input, the checking results with respect to the cycle start packets transmitted from the transmitting device 108, as processed in the CRC checking section 10, are recognized as normal in the receiving device 109 which does have the CRC changing section 3. Accordingly, enabling of the isochronous packet receiving section 23 is asserted in the receiving device 109, enabling reception of isochronous packets of audio data from the tuner 111 of the audio broadcasting receiver and output thereof to the speaker 113.

Figure 18:
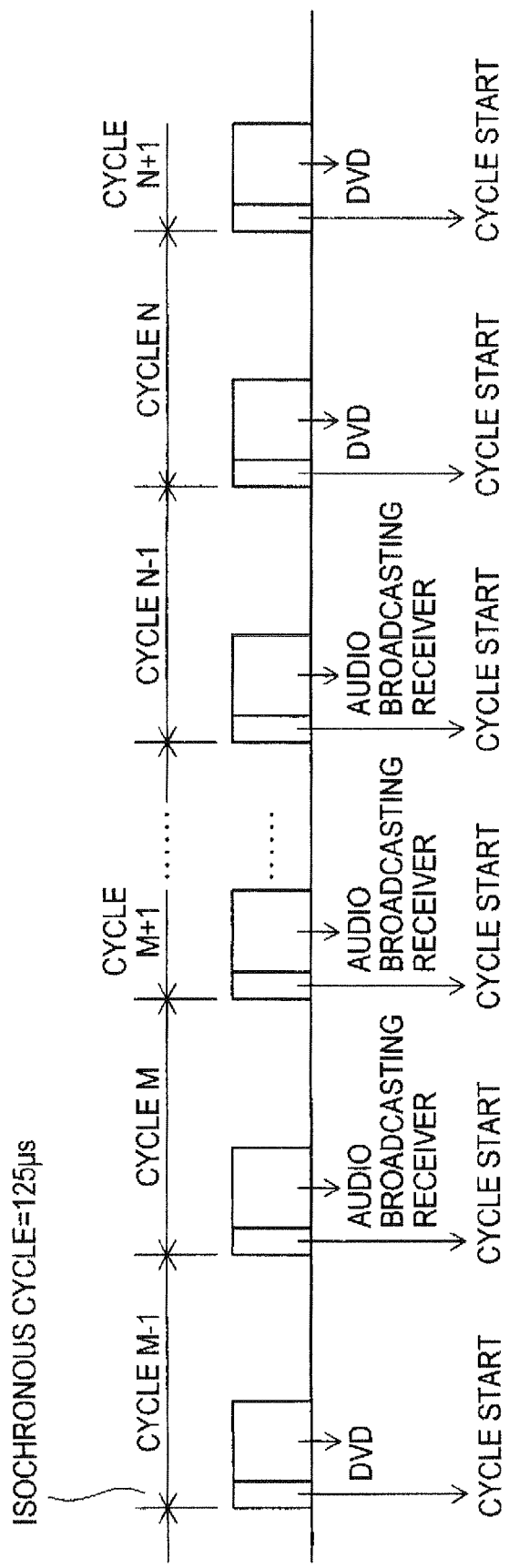
FIG. 18 depicts transfer of packets on the IEEE 1394 bus 200 in the sixth embodiment.
Figure 19:
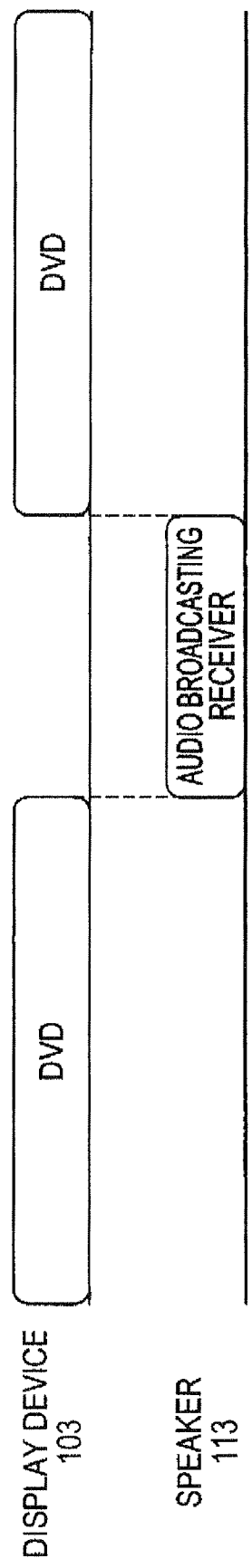
FIG. 19 depicts the contents to be outputted to the display device 103 and a speaker 113 in the sixth embodiment.

FIG. 18 illustrates transfer of packets on the IEEE 1394 bus 200 according to the sixth embodiment as described hereinbefore. FIG. 19 depicts the contents to be outputted to the display device 103 and the speaker 113. In the sixth embodiment as described hereinbefore, in the CRC changing section 3 provided in the transmitting device 108, switching can be made between the through side and the inverted side with respect to the CRC data of the cycle start packets transmitted from the transmitting device 108. Enabling of the isochronous packet receiving section 23 is asserted only at the receiving device, of the receiving devices 109 and 110, which received the compliant cycle start packets, enabling reception of isochronous packets. As a result, isochronous packets to be transferred on the IEEE 1394 bus 200 can be switched as illustrated in FIG. 18, without carrying out procedures such as band releasing and band reservation. Thus, DVD video images and audio of the audio broadcasting receiver are outputted to the display device 103 and the speaker 113, as illustrated in FIG. 19.

Even in an example wherein the cycle start packets are transmitted from the transmitting device-side, instead of the isochronous packet receiving device-side, isochronous packets can be switched without carrying out procedures such as band releasing and band reservation. Of the receiving devices 109 and 110, the device at which isochronous packets are not received has no output, which makes it possible to suppress power consumption.

Here, correspondences with claims are as follows.

An isochronous cycle is one example of a constant cycle.

An isochronous transfer is one example of packet communication time-managed in constant cycles.

A cycle start packet is one example of a first packet.

A CRC and a transaction label t1 are one example of a portion of the first packet.

A CRC is one example of a redundant bit.

As CRC changing section 3 is one example of a redundant bit changing section.

An isochronous packet is one example of a second packet.

As was described in detail earlier, according to the first through 6 embodiments, the CRC changing section 3 is provided in the isochronous packet receiving device 100 or 109 and in the isochronous packet transmitting device 101 or 108. Thus, isochronous packets to be transferred on the IEEE 1394 bus 200 can be switched without carrying out procedures such as band releasing and band reservation. As a result, bus band can be efficiently used, making it possible to suppress power consumption.

According to the second through fourth embodiments, the receiving device 100 has a switching register 13 and a selector 14, in addition to the CRC changing section 3. The selector 14 selects transaction labels t1 of the cycle start packets in accordance with the output of the switching register 13. As a result, isochronous packets can be switched using the transaction labels t1.

According to the third and fourth embodiments, the receiving device 100 and the transmitting device 101 have a status storing register 17 which stores status information of the input device and an MPU 106 which is connected with the status storing register 17. Thus, the MPU 106 monitors the status information of the input device, enabling control of the CRC changing section 3 and the switching register 13. Accordingly, isochronous packets to be transferred can be switched based on the status information of the input device.

Although the embodiments of the present invention have been described in detail, it should be understood that various changes, substitutions, and alterations could be made hereto without departing from the spirit and scope of the invention.

Figure 20:
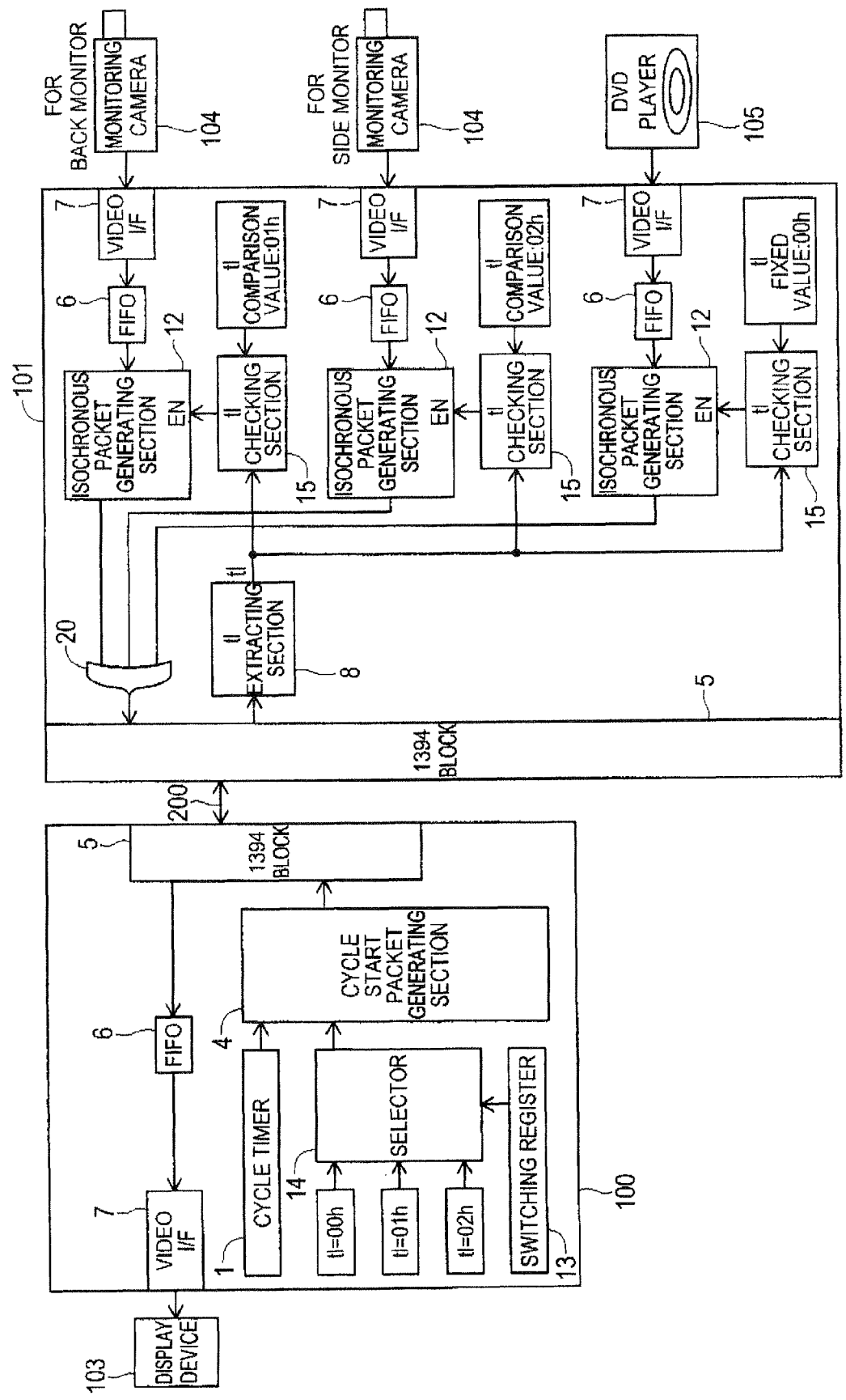
FIG. 20 is a block diagram illustrating connections in a seventh embodiment.

For instance, in the above-described embodiments, a description was given of an example wherein the header_CRC of the cycle start packets is changed to switch the isochronous packets to be transferred. However, this is not limited to this example. The purpose of the embodiment can be realized even in case only the transaction labels t1 are switched. An example of switching the isochronous packets by switching the transaction labels t1 only is illustrated in a seventh embodiment in FIG. 20. Unlike conventional isochronous packet transmitting devices which have one t1 checking section 15, the isochronous packet transmitting device 101 illustrated in FIG. 20 has three t1 checking sections 15. As a result, the transaction labels t1 of the cycle start packets are checked, making it possible to automatically switch the three types of isochronous packets in response to reception of cycle start packets Accordingly, the isochronous packet transmitting device 101 does not transmit isochronous packets which are not to be outputted to the display device 103 connected to the receiving device 100. As a result, bus band can be efficiently used, making it possible to suppress power consumption.

Thus, a portion of the cycle start packets which are changed in the embodiment are not limited to the CRC. Components other than the CRC of the cycle start packets may be changed, as long as changing such components does not result in damages. The CRC is changed by inversion in the CRC changing section 3. It should be noted that the changing method is not limited to this example. The changing method may also include attaching some kind of distinction to the isochronous cycles.

In the above-described embodiments, an example of switching 2 to 3 types of isochronous packets is described. It should be noticed, however, that three or more types of isochronous packets may be switched. Further, the embodiment is also applicable to standards other than the IEEE 1394 standard.

According to the packet communication device and the packet communication method in the embodiment, isochronous packets subjected to isochronous transfer as supported based on the IEEE 1394 standard can be switched without carrying out procedures such as band releasing and band reserving.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions have been described in detail, it should be understood that the various changes, substitutions, and alterations could be made hereto without departing from the spirit and scope of the invention.

What is claimed is:

1. A packet communication device for switching a packet to be transferred in packet communication which is time-managed in constant cycles, the packet communication device comprising:

a changing section configured to change a portion of a first packet to be transmitted in each of the constant cycles, wherein:

the time-managed packet communication represents isochronous transfers as supported based on IEEE 1394 standard;

configuration of the first packet is compliant with the IEEE 1394 standard;

the changing section represents a redundant bit changing section for changing redundant bits in the first packet;

the packet communication device further comprises a plurality of packet transmitting devices;

a transmitting device configured to transmit a packet next is designated from amongst the plurality of transmitting devices, based on a state of the portion of the first packet to be transmitted to the plurality of packet transmitting devices, in each of the constant cycles;

both a transmitting device and a receiving device for second packets which are transferred isochronously have the redundant bit changing section;

at least either one of the transmitting devices and the receiving device comprises:
   a selector configured to select transaction labels of the first packet; and
   a switching register coupled to the selector; and the transmitting device and the receiving device comprise:
   a status storing register configured to store status information of an input device; and
   an MPU coupled to the status storing register;
   wherein the redundant bit changing section and the switching register are controlled by the MPU.

* * * * *